(12) United States Patent
Endo et al.

(10) Patent No.: US 6,225,664 B1
(45) Date of Patent: May 1, 2001

(54) DIELECTRICALLY ISOLATED IC DRIVER HAVING UPPER-SIDE AND LOWER-SIDE ARM DRIVERS AND POWER IC HAVING THE SAME

(75) Inventors: Koichi Endo; Haruki Arai; Kumiko Masuda; Nobuyuki Sato, all of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/301,596

(22) Filed: Apr. 29, 1999

(30) Foreign Application Priority Data

Apr. 30, 1998 (JP) .................................................. 10-121156
Apr. 22, 1999 (JP) .................................................. 11-115418

(51) Int. Cl.$^7$ .................................................. H01L 29/00
(52) U.S. Cl. .............................................................. 257/347
(58) Field of Search .................................... 257/347, 350, 257/351, 354, 349

(56) References Cited

U.S. PATENT DOCUMENTS 5,994,738 * 11/1999 Wpllesen .............................. 257/347

OTHER PUBLICATIONS

Koichi Endo, et al. "Development of Blocking Voltage 600V MOS Gate Driver with SOI Wafer", PCIM Inter '98 Japan Proceedings, 5, 1998.

* cited by examiner

Primary Examiner—Fetsum Abraham
(74) Attorney, Agent, or Firm—Oblon, Spivak, McClelland, Maier & Neustadt, P.C.

(57) ABSTRACT

In an IC driver using SOI dielectric isolation structure having a lower and an upper arm side drivers, the upper arm side driver operates in a floating state, a carrier injector region is disposed in an semiconductor island where a switching device for the upper-side circuit is formed. The IC driver drives a set of an upper-side and a lower-side output power devices, a first main electrode of the upper-side output power device is connected to a high level power supply, a second main electrode of the upper-side output power device is connected to a first main electrode of the lower-side output power device, a second main electrode of the lower-side output power device is connected to ground potential (GND). The carrier injector region is formed deeper than a couple of main electrode regions of the switching device in the upper arm side driver. Moreover, this injector region is connected to an intermediate potential at connecting terminal of the upper-side and the lower-side output power devices. A current for compensating the displacement current $J_d$ flowing in the parasitic condenser $C_{SUB}$ inherent to the SOI structure is supplied through the carrier injector from this intermediate potential terminal, to diminish the extra load of the internal power supply circuit for supplying the upper arm side driver with a predetermined voltage.

25 Claims, 26 Drawing Sheets

DIELECTRICALLY ISOLATED IC DRIVER HAVING UPPER-SIDE AND LOWER-SIDE ARM DRIVERS AND POWER IC HAVING THE SAME

BACKGROUND OF THE INVENTION

1. Field of the Invention

The present invention relates to an integrated circuit having dielectric isolation regions, which switches at a high speed, and more particularly, an IC driver capable of driving output power devices operating with a high breakdown voltage or a high blocking voltage at the high speed. The present invention also relates to a power integrated circuit (referred to as "power IC" hereinafter) merging output power devices and driver/controller for driving/controlling the output power devices in a same semiconductor chip, the chip having dielectric isolation regions, the power IC operating with a high breakdown voltage or a high blocking voltage at the high speed.

2. Description of the Related Art

A semiconductor integrated circuit—using SOI structure where a supporting substrate 1, a buried insulation film (SOI oxide film) 12, and Si films 140, 147, 139, 138, 137 are stacked beginning from the bottom as shown in FIG. 1—is characterized by an easiness for accomplishing a high breakdown voltage or high blocking voltage performance. The SOI semiconductor integrated circuit has the further advantages of small parasitic capacitance of respective integrated elements and an excellent adaptability to the high speed operation. Moreover, if Si films 140, 147, 139, 138, and 137 are made thinner, the SOI structure can suppress the short channel effect of semiconductor devices such as MOSFET (MOS Field Effect Transistor) disposed in the Si film 147 or the like and adopt a finer and finer structure, accomplishing higher integration densities. Usually, the semiconductor integrated circuit having SOI structure is composed by dielectric isolation region of Si films 140, 147, 139, 138, 137 formed on the SOI oxide film 12 into a plurality of islands 140, 147, 139, 138, 137 by element isolation regions composed of a trench side wall oxide film 6 and a buried trench polycrystalline silicon 7. FIG. 1 shows a dielectrically isolated (referred as "DI" hereinafter) integrated circuit of BiCMOS structure wherein a pMOS transistor composed of p$^+$ source region 141 and p$^+$ drain region 142 is disposed in the island 147 of Si, an nMOS transistor composed of n$^+$ source region 511 and n$^+$ drain region 512 in the island 139 of Si and an npn bipolar transistor composed of n$^+$ injector region 601, p base area 602 and n$^+$ collector region 602 in the island 138 of Si. The nMOS transistor is disposed in a p well 501 and p$^+$ contact region 512 is disposed in the p well 501. On the other hand, n$^+$ contact region 143 is disposed in the island 147 of Si.

In the field of power semiconductor device (power device), a DI integrated circuit driver as shown in FIG. 2 is well known. In general, by such DI integrated circuit driver, an output power device unit external to the IC driver is driven. FIG. 2 shows a DI integrated circuit driver, called "half-bridge driver". Particularly when a high breakdown voltage or high blocking voltage is required for the output power device unit, the output power device unit is composed by serial connection of an upper-side output power device $Q_{u1}$ and a lower-side output power device $Q_{d1}$, and this output power device unit is driven by a half bridge driver, as shown in FIG. 2. In this case, one main electrode of the upper-side output power device $Q_{u1}$ is connected to a positive high level power supply 101 while one main electrode of the lower-side output power device $Q_{d1}$ to a ground potential (GND). The other main electrode of the upper-side output power device $Q_{u1}$ and the other main electrode of the lower-side output power device $Q_{d1}$ are connected to a neutral point terminal $N_{n1}$, while this neutral point terminal $N_{n1}$ is connected to a load not illustrated.

As shown in FIG. 2, the upper-side output power device $Q_{u1}$ is driven by an upper-side driver 102 in "a floating state". In other words, an output terminal $N_{u1}$ of the upper-side driver 102 of the IC driver is connected to the control electrode of the external upper-side output power device $Q_{u1}$. On the other hand, an output terminal $N_{d1}$ of the lower-side driver 103 of the IC driver is connected to the control electrode of the external lower-side output power device $Q_{d1}$. The upper-side driver 102 is connected between an internal power supply circuit 105 and the neutral point terminal $N_{n1}$ and supplied with an predetermined power supply voltage. On the other hand, the lower-side driver 103 is connected between a low level power supply 106 and the ground potential (GND) and supplied with an predetermined power supply voltage. An upper-side control signal from an distribution logic 104 is supplied to the upper-side driver 102 via a transistor $Q_c$, while a lower-side control signal from the distribution logic 104 is supplied directly to the lower-side driver 103.

In the semiconductor integrated circuit having SOI structure, the upper-side driver 102, lower-side driver 103, distribution logic 104, internal power supply circuit 105 or the like are disposed respectively in a plurality of islands. In FIG. 2, an upper-side recovery diode $D_{u1}$ is connected in parallel to the nMOSFET as upper-side output power device $Q_{u1}$ and an lower-side recovery diode $D_{d1}$ to the nMOSFET as lower-side output power device $Q_{d1}$.

FIG. 3 also is a circuit diagram showing a similar conventional IC driver. Namely, it shows more in detail the upper-side driver 102 and the lower-side driver 103 composing an IC driver. The upper-side driver 102 is composed of an upper-side CMOS inverter 111, an upper-side buffer amp 121 and an upper-side control logic 131, while lower-side driver 103 is composed of a lower-side CMOS inverter 112, a lower-side buffer amp 122 and a lower-side control logic 132. FIG. 3 shows an example where an insulated gate bipolar transistor (IGBT) is used respectively as external upper-side output power device $Q_{u2}$ and lower-side output power device $Q_{d2}$. An upper-side recovery diode $D_{u2}$ is connected in parallel to the upper-side output power device $Q_{u2}$ and an lower-side recovery diode $D_{d2}$ to the lower-side output power device $Q_{d2}$.

In the circuit configuration shown in FIG. 2 and FIG. 3, the upper-side output power device $Q_{u1}$, $Q_{u2}$ and the lower-side output power device $Q_{d1}$, $Q_{d2}$ are driven by the upper-side driver 102 and the lower-side driver 103 and switched on and off alternatively. As the result, the potential of the neutral point terminal $N_{n1}$, $N_{n2}$ repeats increase and decrease between potential levels of the ground potential (GND) and the high level power supply 101 in accordance with the alternative on and off of the upper-side output power device $Q_{u1}$, $Q_{u2}$ and the lower-side output power device $Q_{d1}$, $Q_{d2}$.

FIG. 4 shows schematically the waveform of this switching state composed of these repeated increases and decreases. FIG. 4 illustrates only the operation of 3 cycles; however, it is obvious that such cycle is repeated for a predetermined period of time. Namely, FIG. 4 shows three outputs sections corresponding to an upper-side output $O_u$ at nodes $N_{u1}$, $N_{u2}$, a neutral output $O_n$ at node $N_{n1}$, $N_{n2}$ and a lower-side output $O_d$ at nodes $N_{d1}$, $N_{d2}$ of FIG. 2 and FIG.

3. Note that inflection points of respective waveforms overlap substantially each other, while the position on the X axis of respective outputs $O_u$, $O_n$, $O_d$ is slightly displaced in FIG. 4 for illustrative convenience. The upper-side output $O_u$ biases the gate of the external upper-side output power device $Q_{u1}$, $Q_{u2}$, while the lower-side output $O_d$ biases the gate of the lower-side output power device $Q_{d1}$, $Q_{d2}$. For the first ½ cycle, the lower-side output power device $Q_d$ supply a predetermined potential (gate bias) $O_d$ measured from the GND, while the upper-side output power device $Q_u$ is almost zero in respect of the neutral point output On. In the following ½ cycle, the output $O_d$ of the lower-side output power device $Q_d$ is almost GND, while the upper-side output power device $Q_u$ feeds the predetermined gate bias $O_u$ measured from the potential of the neutral output $O_n$. As the gate bias is applied alternatively to the gate of upper and lower output power devices (power device) $Q_{u1}$, $Q_{u2}$; $Q_{d1}$, $Q_{d2}$ in respect of respective source potential, the upper-side output power device $Q_{u1}$, $Q_{u2}$ and the lower-side output power device $Q_{d1}$, $Q_{d2}$ are turned on and off alternatively. The neutral point output $O_n$ swings between the high level power supply $V_{pp}$ and GND accordingly.

As shown in FIG. 2 and FIG. 3, the lowest potential of the lower-side driver 103 and the lowest potential of the distribution logic 104 are both fixed to GND. However, the lowest potential of the upper-side driver 102 swings as it increases and decreases in accordance with the variation of the neutral point $N_{n1}$, $N_{n2}$.

FIG. 5A is a circuit diagram showing only the proximity of the CMOS inverter composing the upper-side driver 102 of FIG. 3. As shown in FIG. 5A, the CMOS inverter is composed of a pMOS transistor $Q_{p1}$ and an nMOS transistor $Q_{n1}$, and its output is input in the gate of the IGBT as upper-side output power device $Q_{u2}$. An upper-side recovery diode $D_{u2}$ is connected in parallel to the upper-side output power device $Q_{u2}$.

FIG. 5B is a plane diagram representing this CMOS inverter 111, in which the upper-side output power device $Q_{u2}$ and the upper-side recovery diode $D_{u2}$ shown in FIG. A are not illustrated. As shown in FIG. 5B, the pMOS transistor $Q_{p1}$ is disposed in an n type semiconductor island 147 while the nMOS transistor $Q_{n1}$ is disposed in a p type semiconductor island 157. Respective n type semiconductor island 147 and p type semiconductor island 157 are separated each other by an element isolation region composed of the trench side wall insulation film 6 and the buried trench polycrystalline silicon 7. As shown in FIG. 5B, the pMOS transistor $Q_{p1}$ comprises at least a $p^+$ source region 141, a $p^+$ drain region 142, and an impurity doped polycrystalline silicon (called "doped polycrystalline silicon" hereinafter) gate electrode 144. On the other hand, the nMOS transistor $Q_{n1}$ comprises at least an $n^+$ source region 151, a $n^+$ drain region 152, and a doped polycrystalline silicon gate electrode 154. Moreover, an $n^+$ substrate contact region 143 is disposed in the n type semiconductor island 147, and the $n^+$ substrate contact region 143 and the $p^+$ source region 141 are connected each other, through a metallic wiring 145 from the internal power supply circuit 105. Similarly, a $p^+$ substrate contact region 153 is disposed in the p type semiconductor island 157, and the $p^+$ substrate contact region 153 and the $n^+$ source region 151 are connected each other through a metallic wiring 155 of the neutral point (intermediate) potential. Doped polycrystalline silicon gate electrodes 144, 154 composing the CMOS inverter shown in FIG. 5B are connected to the upper-side buffer amp 121 (see FIG. 3) through a metallic wiring 161, and the drive signal is input to the doped polycrystalline silicon gate electrodes 144, 154 through this metallic wiring 161. Moreover, the $p^+$ drain region 142 of the pMOS transistor $Q_{p1}$ and the $n^+$ drain region 152 of the nMOS transistor $Q_{n1}$ are connected each other through a metallic wiring 162. This metallic wiring 162 is lead to the gate of the IGBT acting as upper-side output power device $Q_{u2}$.

FIG. 5C is a cross-sectional view along the line V—V of FIG. 5B. Namely, FIG. 5C shows a SOI structure where an n type semiconductor island 147, semiconductor islands 148, 149 are formed on the supporting substrate 1 through the SOI oxide film (buried insulation film) 12. In this SOI structure, a MOS capacitor structure is composed where the SOI oxide film (buried insulation film) 12 constitutes the capacitor insulation film, the n type semiconductor island 147 the upper electrode and a back electrode 2 the lower electrode, forming a parasitic condenser $C_{SUB}$. If the supporting substrate 1 has high resistivity and can be taken as a dielectric, the supporting substrate 1 functions as the capacitor insulation film, and if the supporting substrate 1 has so low resistivity that it can be taken substantially as a conductor, the supporting substrate 1 functions as the lower electrode.

Thus, provided with the parasitic condenser $C_{SUB}$, in the SOI structure DI-IC driver (referred as "SOI DI-IC driver" hereinafter), if the neutral point output voltage variation rate dV/dt increases in switching speed more than several kV/μsec, the displacement current $J_d$ in the parasitic condenser $C_{SUB}$ between the semiconductor island 147 arranging a switching device composing the upper-side driver 102 and the back electrode 2 increases. As the consequence, in an IC driver using as device forming area the n type semiconductor island 147 in floating state as shown in FIG. 6, the displacement current $J_d$ flows from the internal power supply circuit 105 to the bottom parasitic MOS (MIS) structure $C_{SUB}$, through the $p^+$ source region 141. Additionally, if the displacement current $J_d$ flows over the driving capability of the internal power supply circuit 105, the power supply voltage decreases, making the operation of the upper-side driver 102 unstable.

However, the switching speed (voltage variation rate) for such half bridge circuit requires in general approximately 20 kV/μsec, and the conventional IC driver requiring a voltage variation rate equal or superior to about 20 kV/μsec will require an excessive current handling capability of the internal power supply circuit, in order to assure a stable operation of the upper-side driver 102.

Thus, in the conventional SOI DI-IC driver, if the high speed operation increases the displacement current $J_d$, to increase the current load of the internal power supply circuit 105 excessively, over the driving capability of the current limit device composing the internal power supply circuit 105, the output voltage happens to decrease. Or, even then the driving capability is not exceeded, a sudden load variation will cause a time lag to feedback this situation, provoking a lower output voltage with this time lag. Therefore, the internal power supply circuit 105 should be made more complex and larger so as to insure higher current handling capability, in order to prevent such output voltage drop. Therefore, the internal power supply circuit 105 will occupy more space, inhibiting minimize of the IC driver chip size. Moreover, a larger internal power supply circuit 105 increases the power dissipation of the driving circuit, lowering the total power conversion efficiency of the system.

Though a pMOS transistor is illustrated in FIG. 6, such problem is not limited to the pMOS transistor. Even in an nMOS transistor, npn bipolar transistor, pnp bipolar transistor, or other semiconductor devices such as diode, such problem may happen in a DI integrated circuit of the structure having a p diffusion layer or n diffusion layer forming the semiconductor island presenting the floating state and where this p diffusion layer or n diffusion layer is connected to the internal power supply circuit or other circuit than the internal power supply circuit. For example, a similar problem may happen in a case where a p well exists in an n type semiconductor island and an nMOS transistor is formed therein. In many IC drivers, the p well in the n type semiconductor island is connected to the low potential side, or to the reference potential (neutral point potential). This case will not present the floating state and the problem may not be significant. However, in the nMOS transistor where the p well is used in floating state, namely lifted from the reference potential, the displacement current $J_d$ flows in the bottom parasitic MOS (MIS) structure, and the extra current of the internal power supply circuit increases excessively, to lower the output voltage of the internal power supply circuit disadvantageously or to affect the other circuit than the internal power supply circuit to fluctuate the circuit parameters and circuit operation detrimentally.

If we suppose a power IC in which Zener diodes $ZD_u$ and $ZD_d$ are connected between the gate and source electrodes of the respective upper-side output power device $Q_{u1}$ and lower-side output power device $Q_{d1}$ as shown by broken lines in FIG. 2, the electron current flows from cathode to anode direction of the Zener diode $ZD_u$ for compensating the displacement current $J_d$ in the bottom of parasitic MOS (MIS) structure, thereby causing a sudden drop of the gate potential of the upper-side output power device $Q_{u1}$, resulting in an undesired malfunction of the system. Then electrons can be injected from the n diffused layer, causing similar disadvantage as the case for the p diffused layer. Instead of the gate of the upper-side output power device $Q_{u1}$, if the n diffused layer is connected to a specific circuitry, the electrons injected from the n diffused layer for compensating the displacement current $J_d$ in the bottom of parasitic MOS (MIS) structure affect the specific circuitry so as to fluctuate the circuit parameters.

Therefore, the displacement current $J_d$ in the bottom of parasitic MOS (MIS) structure becomes significant in various situations and various structures irrespective of p or n diffused layer, to make circuit parameters of the DI integrated circuit seriously changeable and unreliable.

SUMMARY OF THE INVENTION

In view of the problem mentioned above, the object of the present invention lies in providing an IC driver having the DI structure for driving a series circuit of an upper-side and a lower-side output power devices, the IC driver always accomplishes an stable operation even when the voltage variation rate dV/dt increases with high speed switching of these upper-side and lower-side output power devices.

Another object of the present invention is to provide a stable IC driver having the DI structure for driving a series circuit of an upper-side and a lower-side output power devices, the IC driver having a structure for compensating or reducing the displacement current flowing in the parasitic condenser inherent to the DI structure, so that circuit parameters of the IC driver can be kept stable.

Still another object of the present invention is to provide a compact and stable IC driver having the DI structure for driving a series circuit of an upper-side and a lower-side output power devices, downsizing the occupation area for the internal power supply circuit for supplying power to the circuit or the semiconductor element operating with floating condition.

Still another object of the present invention is to provide a high speed and stable IC driver having the DI structure for driving a series circuit of an upper-side and a lower-side output power devices, ensuring a high electric power conversion efficiency.

Still another object of the present invention is to provide a power IC merging a series circuit of an upper-side and a lower-side output power devices and the driver circuit for driving the upper-side and lower-side output power devices in a single semiconductor chip, the power IC always accomplishes a stable operation even when the voltage variation rate dV/dt increases with high speed switching of these upper-side and lower-side output power devices.

Still another object of the present invention is to provide a stable power IC having a structure for compensating or reducing the displacement current flowing in the parasitic condenser inherent to the DI structure, so that circuit parameters of the power IC can always be kept stable.

Still another object of the present invention is to provide a compact and stable power IC driver having the DI structure, downsizing the occupation area for the internal power supply circuit for supplying power to the circuit or the semiconductor element operating with floating condition.

Still another object of the present invention is to provide a high speed and stable power IC driver having the DI structure, ensuring a high electric power conversion efficiency with a high breakdown voltage or a high blocking voltage.

To achieve the objects, a first aspect pertains to an IC driver for driving a series circuit of an upper-side and a lower-side output power devices. The IC driver of the first aspect comprises an semiconductor island separated by dielectric film at its bottom and side thereof, a switching device disposed in the semiconductor island and an injector region for injecting carriers having a conductivity type identical to that of carriers constituting main current of the switching device disposed in the semiconductor island. The switching device has first and second main electrode regions disposed in the semiconductor island. And the second main electrode region is connected to a control electrode of one of the upper-side and lower-side output power devices which operates in a floating state. Further, the injector region is disposed at a position separated from the switching device. The IC driver has a DI structure in which the semiconductor island, or the semiconductor island is separated by dielectric isolation regions comprising the dielectric film at the bottom and side. The series circuit of the upper-side and lower-side output power devices is composed for handling higher voltages. In most cases, a first main electrode of the upper-side output power device is connected to a positive high level power supply, a second main electrode of the upper-side output power device is connected to a first main electrode of the lower-side output power device, a second main electrode of the lower-side output power device is connected to ground potential (GND). In this case, "the switching device disposed in the semiconductor island" is supplied with high level power supply. Here, "the switching device disposed in the semiconductor island " may be a pMOS transistor, pnp bipolar transistor(BJT), p channel static inductive transistor (SIT) SIT or other p channel semiconductor devices. Then, "the carrier having a conductivity type identical to that of carrier constituting main current of the switching device" corresponds to the hole and a p type injector region should be disposed in the n type semiconductor island. On the contrary, if a lower-side output power device is connected to the negative high level power supply, the lower-side output power device and the switching device whose output is connected to the control electrode of the lower-side output power device are in a floating state. In this negative high level power supply case, the above potential relation, the polarity, the conductivity type must be reversed, and "the switching device disposed in the semiconductor island " may be an nMOS transistor, npn-BJT, or n channel SIT. Then, "the carrier constituting main current of the switching device" corresponds to electrons and an n type injector region should be disposed in p type semiconductor island. Here, the "first main electrode region" means either of source region/drain region in FETs or SITs, and the "second main electrode region" means the other of remaining source region/drain region. Similarly, for BJTs, the "first main electrode region" means either of emitter region/collector region, and the "second main electrode region" means the other of remaining emitter region/collector region. Namely, electrodes other than the control electrode, such as gate electrode or base electrode, are called the "first/second main electrode" in the present invention.

To supply the carrier, which will be injected from the injector region, it is preferable that the injector region is connected to a predetermined reference potential. For example, this reference potential may, in an IC driver for driving the upper-side and lower-side output power devices, be the potential at the intermediate point, or the connecting point between these upper-side and lower-side power devices. The reference potential may well be selected conveniently in accordance with the specifications of the objective circuit configurations. It is preferable to form the injector region deeper than the main electrode region of the switching device, because displacement current component can be provided promptly from the injector region, when it is biased until the condition where an inversion layer is generated at the bottom of the semiconductor island, or the interface between the semiconductor island and the bottom dielectric film. For switching the output power device at high speed, the IC driver must operate at the high speed and large amount of carrier for charging/discharging a parasitic condenser inherent to the bottom dielectric film, or the displacement current is required. By providing the injector region of the first aspect, the corresponding current compensating the displacement current can be fed from the injector region, and a stable operation of the IC driver is assured. If a voltage for operating the switching device is supplied from an internal power supply circuit, an extra current load current, for compensating the displacement current, will not be required for the internal power supply circuit . At the same time, the internal power supply circuit may easily be miniaturized and simplified, allowing to reduce the chip size and the power dissipation of the IC driver. If the switching device is connected to a specific circuitry other than the internal power supply circuit, the fluctuation of the circuit parameters relating to the specific circuitry subjected to the displacement current is suppressed or minimized, since the displacement current can be compensated by the injector region, and stable operation of the IC driver is always assured.

A second aspect relates to an IC driver for driving a series circuit of an upper-side and a lower-side output power devices. Namely the IC driver of the second aspect comprises a supporting substrate, a buried insulation film disposed on the supporting substrate, a first semiconductor island of a first conductivity type and other semiconductor islands adjacent to the first semiconductor island disposed on the buried insulation film, a dielectric isolation region for separating each other the first semiconductor island from other semiconductor islands adjacent to the first semiconductor island, a switching device having first and second main electrode regions of a second conductivity type opposite to the first conductivity type, disposed in the first semiconductor island and an injector region of the second conductivity type disposed in the first semiconductor island. The second main electrode region is connected to a control electrode of one of the upper-side and lower-side output power devices which operates in a floating state. And the injector region is disposed separately from the first and second main electrode regions. The IC driver has a SOI structure in which the buried insulation film is sandwiched between the supporting substrate and the first semiconductor island. As similar to the first aspect, in most cases, a first main electrode of the upper-side output power device is connected to a positive high level power supply, a second main electrode of the upper-side output power device is connected to a first main electrode of the lower-side output power device, and a second main electrode of the lower-side output power device is connected to ground potential (GND). In this case, the switching device disposed in the first semiconductor island is supplied with high level power supply. Then the switching device operates in the floating state, since the intermediate point between the upper-side and lower-side power devices swings between the potential of the high level power supply and ground potential (GND). In this case, the switching device may be a pMOS transistor, pnp-BJT, p channel SIT or other p channel semiconductor devices. On the contrary, if a lower-side output power device is connected to the negative high level power supply, the lower-side output power device and the switching device whose output is connected to the control electrode of the lower-side output power device are in a floating state. In this negative high level power supply case, the switching device may be an nMOS transistor, npn-BJT, or n channel SIT. The injector region supplies displacement current flowing in a parasitic condenser inherent to this SOI structure. As defined in the first aspect, the "first main electrode region" means either of source/drain region in FETs or SITs or either of emitter/collector region in BJT, and the "second main electrode region" means the other of remaining source/drain region or emitter/collector region.

The injector region for injecting carriers according to the second aspect of the present invention may be connected to the predetermined reference potential. For example, this reference potential may be the potential at the intermediate point between the upper-side and lower-side power devices. The reference potential may well be selected conveniently in accordance with the specifications to which the IC driver is applied. By providing the injector region of the second aspect, the corresponding current for compensating the displacement current can be fed from the injector region, and a stable operation of the IC driver is assured. In a case that a voltage for operating the switching device is supplied from an internal power supply circuit formed in the IC driver, an extra load current for compensating the displacement current flowing in a parasitic condenser inherent to the SOI structure will not be required against the internal power supply circuit. At the same time, the internal power supply circuit may easily be miniaturized and simplified, thereby allowing reduction of the chip size and the power dissipation of the IC driver. If the switching device is connected to a specific circuitry other than the internal power supply circuit, the fluctuation of the circuit parameters relating to the specific circuitry subjected to the displacement current is suppressed or minimized, since the displacement current can be compensated by the injector region. Then the circuit parameters of the IC driver becomes unsusceptible to the displacement current, and stable and reliable operation is always implemented.

A third aspect of the present invention pertains an IC driver for driving a set of an upper-side and a lower-side output power devices. Here a first main electrode of the upper-side output power device is connected to a high level power supply, a second main electrode of the upper-side output power device is connected to a first main electrode of the lower-side output power device, and a second main electrode of the lower-side output power device is connected to ground potential (GND). The IC driver comprises first to third semiconductor islands electrically isolated from the adjacent semiconductor islands by a bottom dielectric film and a side dielectric film, an upper-side driver, an injector region for supplying displacement current flowing in a parasitic condenser having the bottom dielectric film as a capacitor insulating film, a lower-side driver and an internal power supply circuit for supplying the upper-side driver with a predetermined voltage. And the upper-side driver comprises at least a switching device disposed in the first semiconductor island and an output of the upper-side driver is connected to a control electrode of the upper-side output power device. The injector region is also disposed in the first semiconductor island. The lower-side driver comprises another switching device disposed in the second semiconductor island and an output of the lower-side driver is connected to a control electrode of the upper-side output power device. Further, the internal power supply circuit is disposed in the third semiconductor island. If the first main electrode of the upper-side output power device is connected to a positive high level power supply, the switching device disposed in the first semiconductor island is formed of p channel semiconductor devices, and if the first main electrode of the upper-side output power device is connected to a negative high level power supply, the switching device disposed in the first semiconductor island is formed of n channel semiconductor devices. Here, the injector region according to the third aspect of the present invention may be connected to a predetermined reference potential, such as the intermediate potential between the upper-side and lower-side power devices.

According to the third aspect of the present invention, by providing an injector region in the first semiconductor island where the switching device is formed to constitute an upper-side driver, the current for compensating the displacement current flowing the parasitic condenser inherent to the SOI structure is supplied by the injector region, and no extra current flows through the internal power supply circuit. Therefore, an extra current load will not be required from the internal power supply circuit even when a large displacement current is followed by a rapid/high voltage switching. This will, thus, assure a stable and a high speed IC driver operation for driving the upper-side and lower-side output power devices. At the same time, the internal power supply circuit may easily be miniaturized and simplified, allowing reduction in the chip size and the power dissipation.

A fourth aspect of the present invention pertains to a power IC, in which output power devices and control/drive circuits for controlling/driving the output power devices are both monolithically integrated on a same semiconductor chip. Namely, the power IC according to the fourth aspect of the present invention comprises a semiconductor chip, an upper-side output power device merged in the semiconductor chip, a lower-side output power device merged in the semiconductor chip, first to third semiconductor islands electrically isolated from the adjacent semiconductor islands by a bottom dielectric film and a side dielectric film, an upper-side driver, an injector region for supplying displacement current component flowing in a parasitic condenser having the bottom dielectric film as a capacitor insulating film, a lower-side driver and an internal power supply circuit for supplying the upper-side driver with a predetermined voltage. Here, a first main electrode of the upper-side output power device is connected to a high level power supply and a second main electrode of the upper-side output power device is connected to a first main electrode of the lower-side output power device, a second main electrode of the lower-side output power device is connected to ground potential (GND). And the first to a third semiconductor island are isolated by a bottom dielectric film and a side dielectric film. The upper-side driver comprises at least a switching device disposed in the first semiconductor island, an output of the upper-side driver is connected to a control electrode of the upper-side output power device. The injector region is also disposed in the first semiconductor island. The lower-side driver comprises another switching device disposed in the second semiconductor island, an output of the lower-side driver is connected to a control electrode of the upper-side output power device. The internal power supply circuit is disposed in the third semiconductor island. If the first main electrode of the upper-side output power device is connected to a positive high level power supply, the switching device disposed in the first semiconductor island formed of p channel semiconductor devices, and if the first main electrode of the upperside output power device is connected to a negative high level power supply, the switching device disposed in the first semiconductor island is formed of n channel semiconductor devices. Moreover, as upper-side output power device, and/or lower-side output power device, IGBT, MOSFET, gate turn off (GTO) thyristor, SIT, SI thyristor or other various output power devices can be applied. Here, the injector region according to the fourth aspect of the present invention may be connected to a predetermined reference potential, such as the intermediate potential between the upper-side and lower-side output power devices.

According to the fourth aspect of the present invention, by providing an injector region in the first semiconductor island, the current for compensating the displacement current flowing the parasitic condenser inherent to the DI structure is supplied by the injector region, and no additional current for compensating the displacement current flows through the internal power supply circuit. Therefore, an extra current load will not be required for the internal power supply circuit even when a large displacement current flows due to high speed and high voltage switching. This will, thus, assure a stable and high speed operation of the IC driver having the upper-side/lower-side output power devices and the upper-side driver/lower-side drivers merged in a same chip. At the same time, the internal power supply circuit may easily be miniaturized and simplified, allowing reduction of the total chip size of the power IC and the power dissipation of the driver circuit.

Other and further objects of the present invention will become obvious upon an understanding of the illustrative embodiments about to be described in connection with the accompanying drawings or will be indicated in the appended claims, and various advantages not referred to herein will occur to one skilled in the art upon employing the invention in practice.

DETAILED DESCRIPTION OF THE PREFERRED EMBODIMENTS

Figure 1:
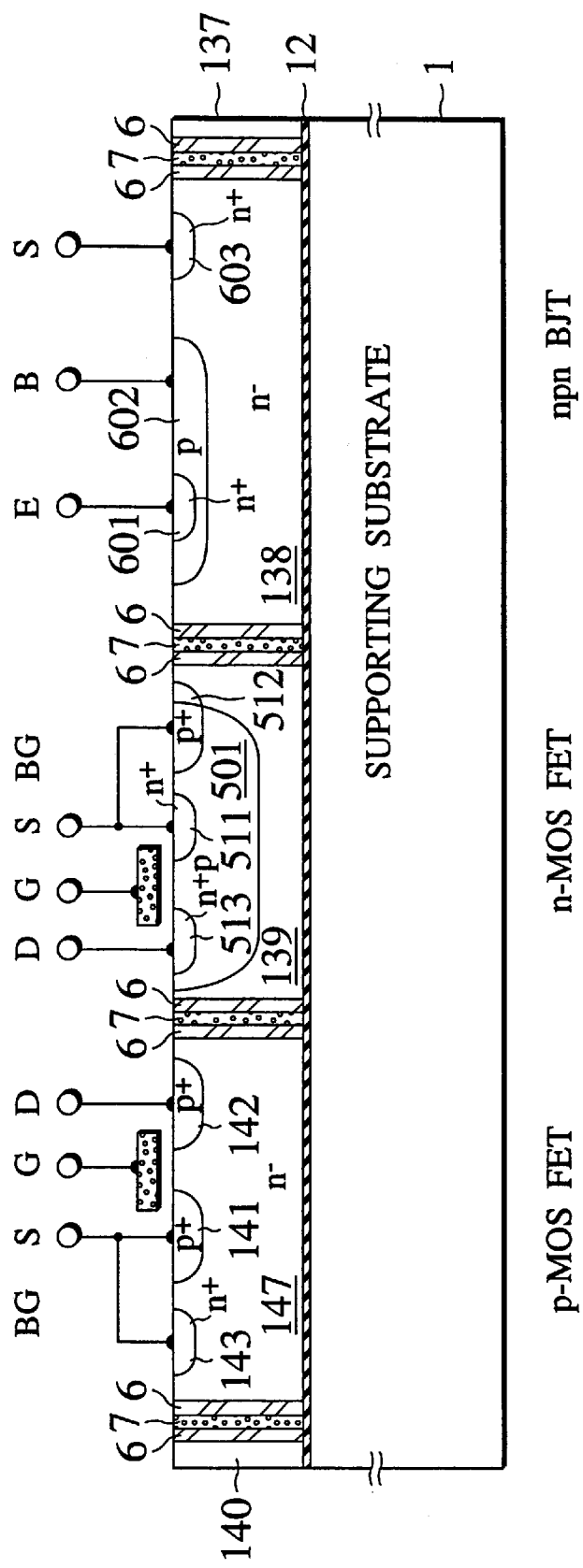
FIG. 1 is a cross-sectional view showing a DI integrated circuit having a conventional SOI structure.
Figure 2:
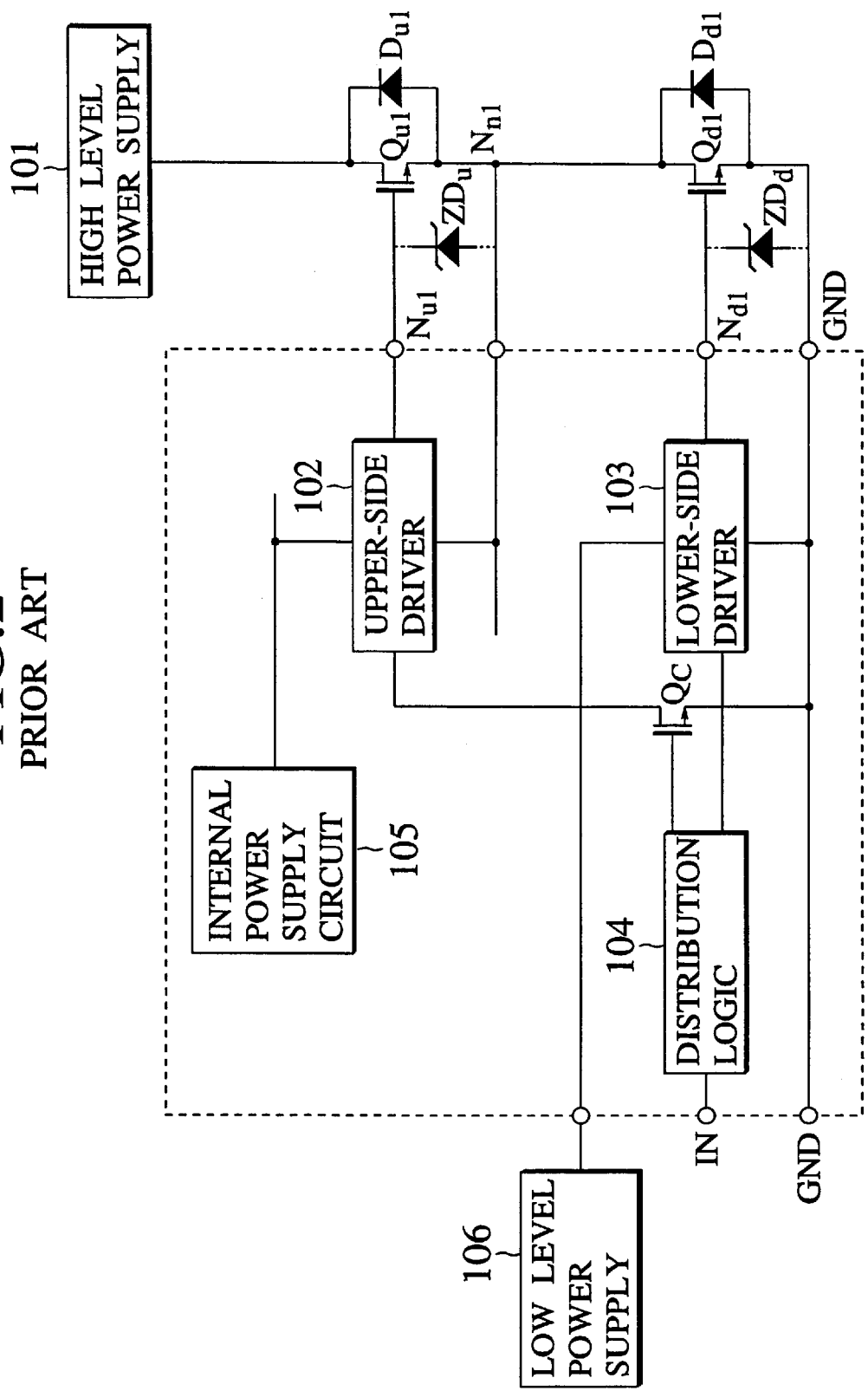
FIG. 2, is a circuit diagram of an output power unit and a conventional IC driver for driving the output power unit.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

(FIRST EMBODIMENT)

Figure 6:
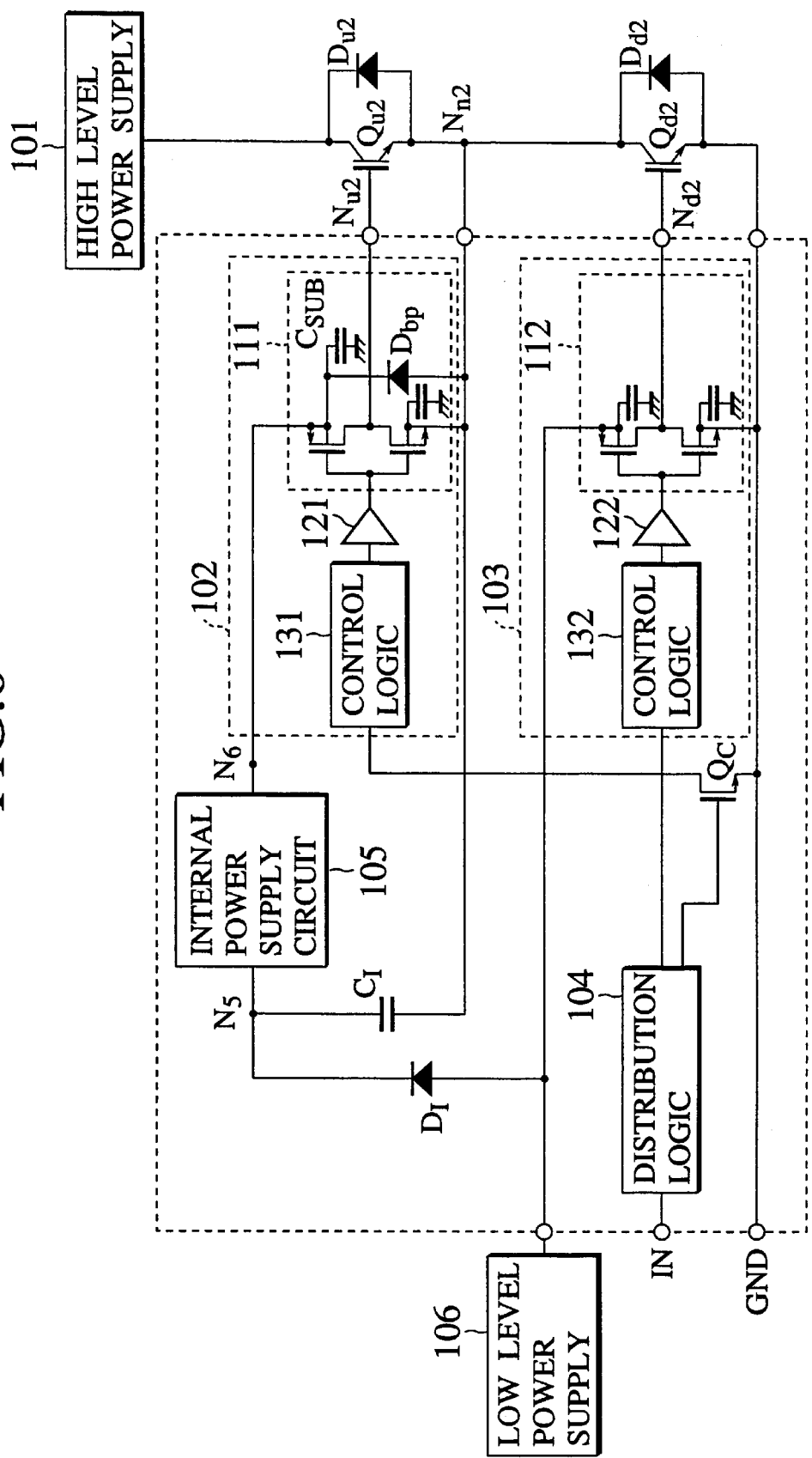
FIG. 6 is a circuit diagram of an output power unit and an IC driver for driving the output power unit according to a first embodiment of the present invention.

FIG. 6 is a circuit diagram of the IC driver according to the first embodiment of the present invention. The IC driver according to the first embodiment of the present invention is, as mentioned above, a DI integrated circuit driver, called "half-bridge driver" for driving an output power unit, in which an upper-side output power device $Q_{u1}$ and a lower-side output power device $Q_{d1}$ are connected in series, as shown in FIG. 6. This is an example of the case where IGBT is used respectively as external upper-side output power device $Q_{u2}$, and lower-side output power device $Q_{d2}$, but it is evident that other output power devices such as MOSFET, GTO thyristor, SIT, SI thyristor or the like may also be used. One main electrode (first main electrode) of the upper-side output power device $Q_{u2}$ is connected to the high level power supply 101, while one main electrode (second main electrode) of the lower-side output power device $Q_{d2}$ is connected to the ground potential (GND). The other main electrode (second main electrode) of the upper-side output power device $Q_{u2}$ and the other main electrode (first main electrode) of the lower-side output power device $Q_{d2}$ are connected to an intermediate potential terminal $N_{n2}$, while a load to which this intermediate potential terminal $N_{n2}$ is connected is not illustrated. An upper-side recovery diode $D_{u2}$ is connected in parallel to the upper-side output power device $Q_{u2}$ and an lower-side recovery diode $D_{d2}$ to the lower-side output power device $Q_{d2}$.

As shown in FIG. 6, the upper-side output power device $Q_{u2}$ is driven by an upper-side driver 102 in a floating state. In other words, an output terminal $N_{u2}$ of the upper-side driver 102 of the IC driver is connected to the control electrode of the external upper-side output power device $Q_{u2}$. On the other hand, an output terminal $N_{d2}$ of the lower-side driver 103 of the IC driver is connected to the control electrode of the external lower-side output power device $Q_{d2}$. The upper-side driver 102 is connected between an internal power supply circuit 105 and the intermediate potential terminal $N_{n2}$ and supplied with a predetermined power supply voltage. On the other hand, the lower-side driver 103 is connected between a low level power supply 106 and the ground potential (GND) and supplied with a predetermined power supply voltage. An upper-side control signal from a distribution logic 104 is supplied to the upper-side driver 102 via a transistor $Q_c$, while a lower-side control signal from a distribution logic 104 is supplied directly to the lower-side driver 103.

As shown in FIG. 6, the upper-side driver 102 is composed of an upperside CMOS inverter 111, an upper-side buffer amp 121 and an upper-side control logic 131. On the other hand, the lower-side driver 103 is composed of a lower-side CMOS inverter 112, a lower-side buffer amp 122 and a lower-side control logic 132.

In the circuit configuration shown in FIG. 6, the upper-side output power device $Q_{u2}$ and the lower-side output power device $Q_{d2}$ are driven by the upper-side driver 102 and the lower-side driver 103 and turned on and off alternatively at a high voltage. As the result, the potential of the intermediate potential terminal $N_{n2}$ swings between potential levels of the ground potential (GND) and the high level power supply 101 in accordance with the alternative turning on and off of the upper-side output power device $Q_{u2}$ and the lower-side output power device $Q_{d2}$.

Figure 7A:
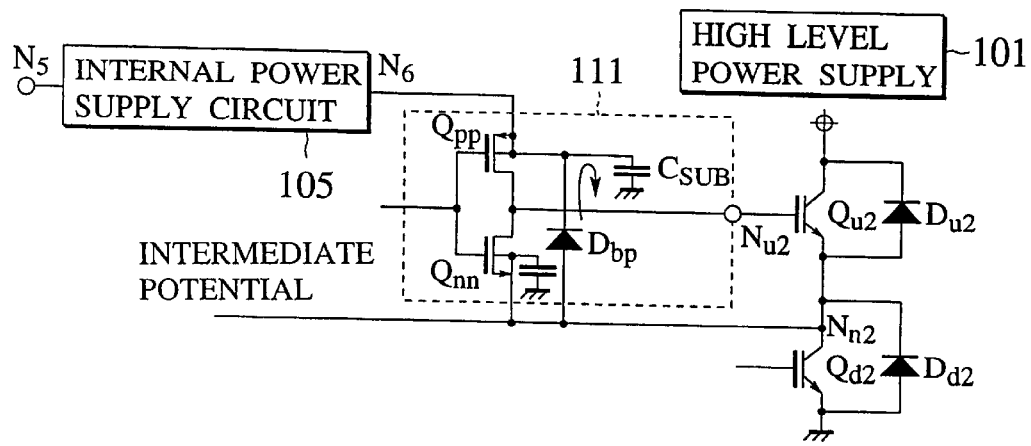
FIG. 7A is a circuit diagram showing the proximity of the output stage CMOS inverter of the upper-side driver of FIG. 6

FIG. 7A is a circuit diagram showing a portion extracted from the upper-side driver of the IC driver according to the first embodiment of the present invention shown in FIG. 6. CMOS inverter 111 is composed of a pMOS transistor $Q_{pp}$ and nMOS transistor $Q_{nn}$. A source electrode (first main electrode) of the pMOS transistor $Q_{pp}$ is connected to the internal power supply circuit 105 and a drain electrode (second main electrode) to the drain electrode of the nMOS transistor $Q_{nn}$. And a substrate electrode of the pMOS transistor $Q_{pp}$ is connected simultaneously to the source electrode of the pMOS transistor $Q_{pp}$, and to the intermediate potential terminal $N_{n2}$ through a bypass diode $D_{bp}$.

Figure 7B:
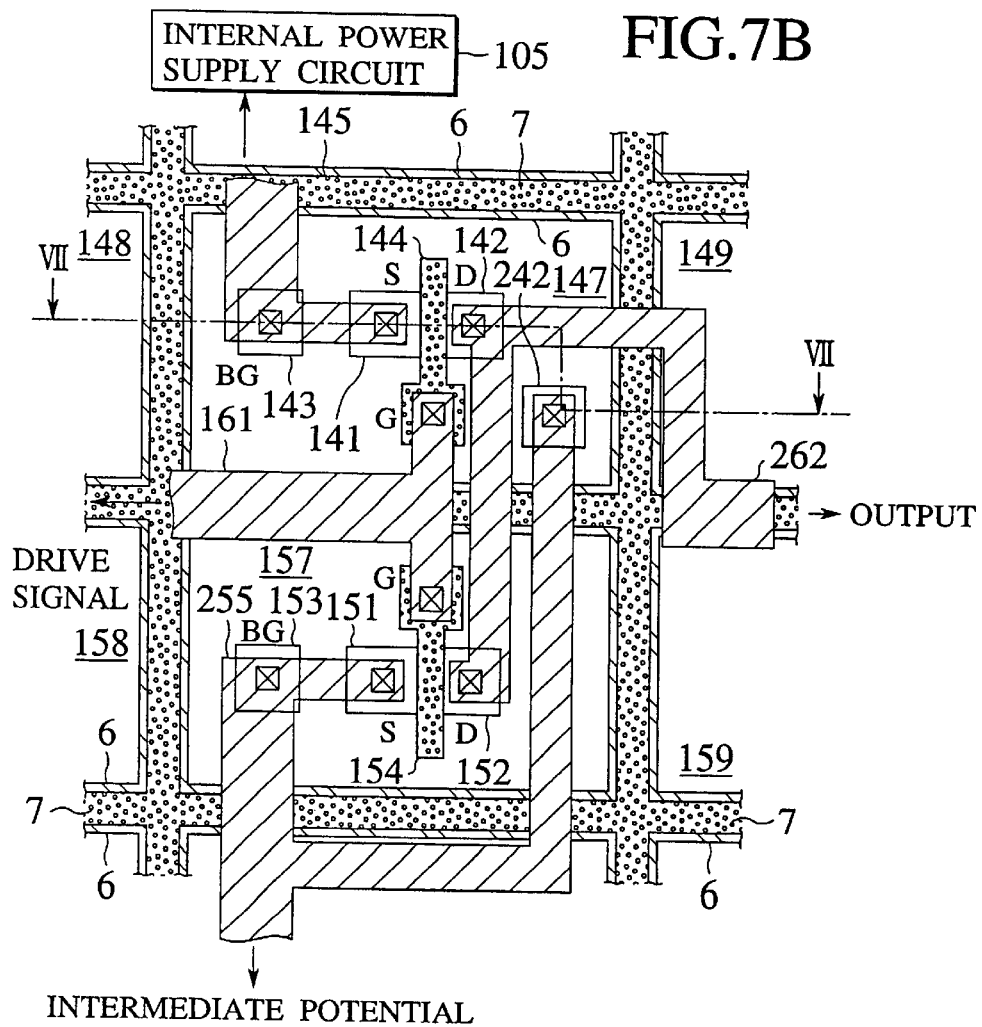
FIG. 7B is a plan view of the pattern of the CMOS inverter shown in FIG. 7A.

FIG. 7B is a partial plan view corresponding to FIG. 7A, and shows plurality of semiconductor islands 147, 148, 149, 157, 158, 159, . . . Namely FIG. 7B shows in details a partial plan view of the CMOS inverter 111. Meanwhile, the lower-side driver 103 having the CMOS inverter 112 disposed in a semiconductor island (second semiconductor island) is omitted in the figures. According to the first embodiment of the present invention, the pMOS transistor $Q_{pp}$ is disposed in an n type semiconductor island (first semiconductor island) 147, while nMOS transistor $Q_{nn}$ is disposed in an p type semiconductor island 157. Respective n type semiconductor island (first semiconductor island) 147 and p type semiconductor island 157 are isolated from each other by an element isolation region composed of the trench side wall insulation film 6 and the buried trench polycrystalline silicon 7. The pMOS transistor $Q_{pp}$ comprises at least a $p^+$ source region (first main electrode region) 141, a $p^+$ drain region 142 (second main electrode region), and a doped polycrystalline silicon gate electrode 144. On the other hand, the nMOS transistor $Q_{nn}$ comprises at least an $n^+$ source region 151, an $n^+$ drain region 152, and a doped polycrystalline silicon gate electrode 154. Moreover, an $n^+$ substrate contact region 143 is disposed in the n type semiconductor island 147, and the $n^+$ substrate contact region 143 and the $p^+$ source region 141 are connected to each other, through a metallic wiring 145 from the internal power supply circuit 105 disposed in another semiconductor island (third semiconductor island). Additionally, a p injector region 242 composed of p diffusion layer is disposed in the n type semiconductor island 147. This p injector region 242 is connected to the intermediate potential terminal $N_{n2}$ through a metallic wiring 255. This intermediate potential metallic wiring connects also the $p^+$ substrate contact region 153 and the $n^+$ source region 151 disposed in the p type semiconductor island 157. Doped polycrystalline silicon gate electrodes 144, 154 composing the input electrode of the CMOS inverter 111 are connected to the upper-side buffer amp 121 through a metallic wiring 161. The drive signal is input to the doped polycrystalline silicon gate electrodes 144, 154 through this metallic wiring 161. Moreover, the $p^+$ drain region 142 of the pMOS transistor $Q_{pp}$ and the $n^+$ drain region 152 of the nMOS transistor $Q_{nn}$ are connected to each other through a metallic wiring 262. This metallic wiring 262 is lead to the gate of the IGBT acting as upper-side output power device $Q_{u2}$.

Figure 7C:
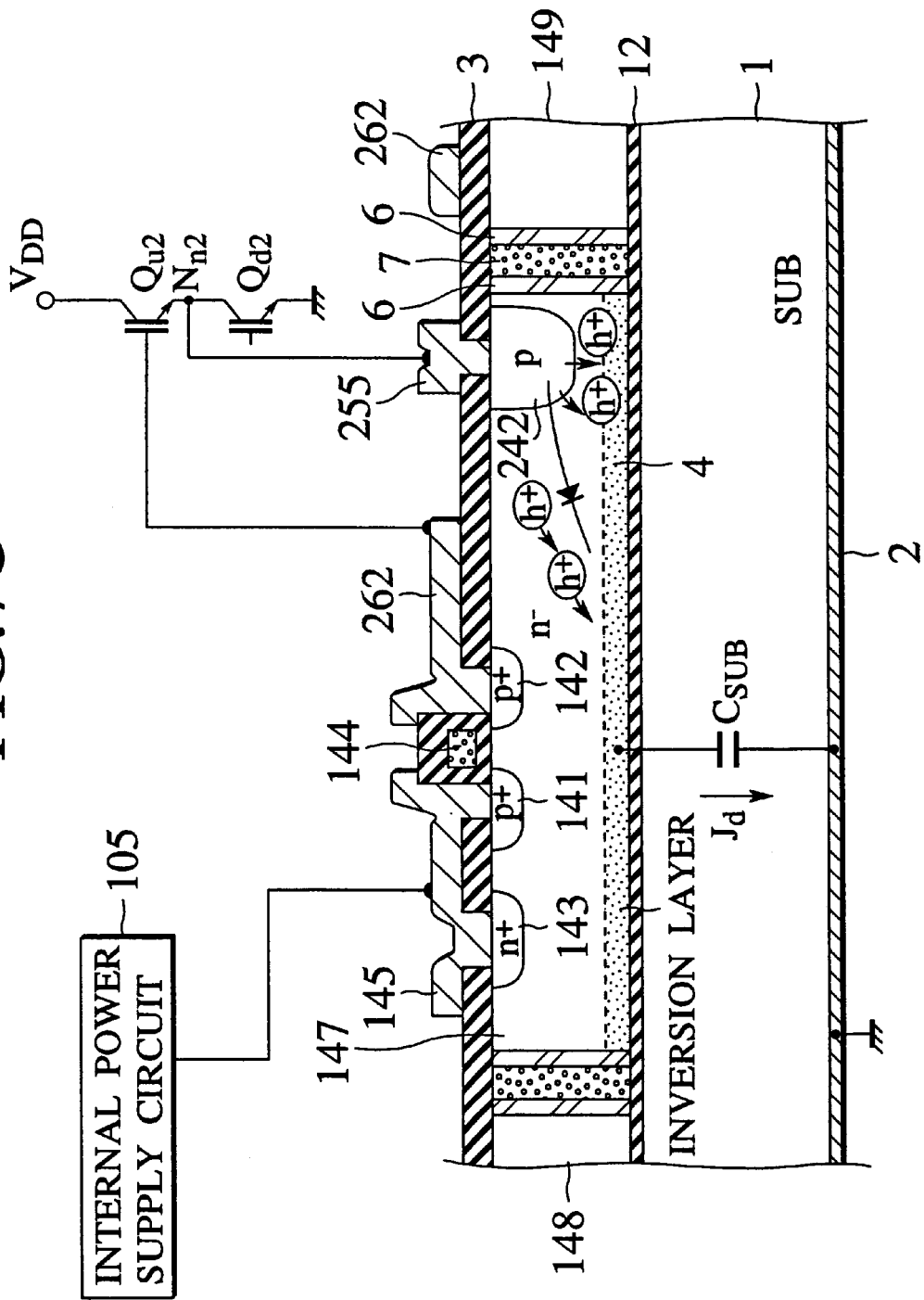
FIG. 7C is a cross-sectional view along VII—VII direction of FIG. 7B.

FIG. 7C is a cross-sectional view along VII—VII direction of FIG. 7B. Similarly to the prior art, this SOI structure has the n type semiconductor island 147 and semiconductor islands 148, 149 formed on the supporting substrate 1 through the SOI oxide film (buried insulation film). In other words, the IC driver according to the first embodiment of the present invention has an electrically isolated semiconductor island 147, cladded by a bottom dielectric film 12 and a side dielectric film 6, a switching device comprising at least the $p^+$ source region 141, $p^+$ drain region 142 and a doped polycrystalline silicon gate electrode 144 is disposed in this electrically isolated semiconductor island 147. This switching device is a pMOS transistor acting in floating state, where the hole is the carrier of the main current. And as shown in FIG. 7C, the IC driver according to the first embodiment of the present invention has a p injector region 242 disposed in the semiconductor island (n type semiconductor island) 147 composed of a relatively deep diffusion layer. The potential of the p injector region 242 is connected to the intermediate potential terminal $N_{n2}$ as shown in FIG. 6. As shown in FIG. 7C, the n type semiconductor island 147 formed on the SOI oxide film 12 is dielectrically isolated from the other semiconductor islands 148, 149, . . . by an element isolation region composed of the trench side wall oxide film 6 and the buried trench polycrystalline silicon 7.

As shown in FIG. 7C, under the condition that the p injector region 242 composed of relatively deep p diffusion layer is provided in the isolated n type semiconductor island 147, if the device potential changes in respect of the substrate potential, the displacement current $J_d$ flowing in the parasitic condenser $C_{SUB}$ composed of the SOI oxide film (buried insulation film) 12, n type semiconductor island 147 and the back electrode 2 is mainly supplied by hole injection from the p injector region 242. These holes never pass through the internal power supply circuit 105, because they flow from the intermediate potential terminal $N_{n2}$ through a by-pass diode $D_{bp}$. As the consequence, the voltage drop of the internal power supply circuit due to the displacement current $J_d$, which was troublesome conventionally, will hardly occur.

Figure 8:
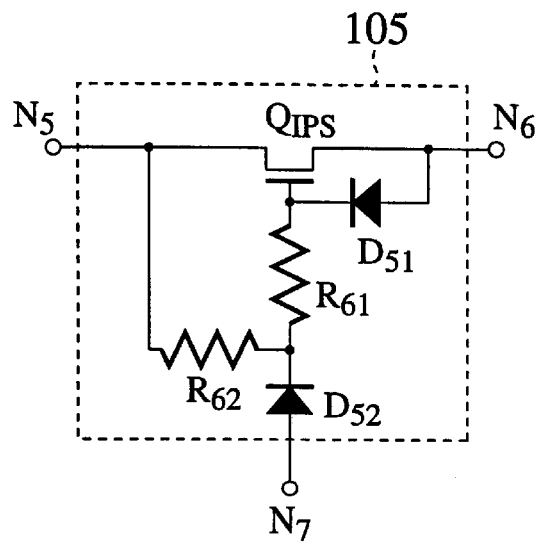
FIG. 8 is a circuit diagram of an internal power supply circuit used for the IC driver according to the first embodiment of the present invention.

FIG. 8 shows the details of the "bootstrap type" power supply circuit as one of examples of the internal power supply circuit 105 for the IC driver according to the first embodiment of the present invention. Node $N_5$ is used as input terminal, node $N_6$ as output terminal and node $N_7$ as common terminal. The node $N_5$ is connected to the low level power supply 106 through a diode $D_1$ as shown in FIG. 6, and the node $N_6$ is connected to the source electrode (source region) of the pMOS transistor $Q_{pp}$ in the upper-side driver as shown in FIG. 6. Though it is not shown in FIG. 6, the node $N_7$ shown in FIG. 8 is connected to the intermediate potential of the node $N_{n2}$ in the upper arm circuit block. The potential at node $N_6$ is fed back to the gate electrode of nMOS transistor $Q_{IPS}$ through a diode 52 to output a constant voltage. The diode $D_1$ is designed to have the same breakdown voltage as the upper-side output power device $Q_{u2}$ and the lower-side output power device $Q_{d2}$. It is important that a condenser $C_1$ is connected to the common connection point of the diode $D_1$, and the use of this condenser $C_1$ allows execution of the following bootstrap method operation:

(1) When the lower-side output power device $Q_{d2}$ is ON-state and the upper-side output power device $Q_{u2}$ is OFF-state:

As the potential of the intermediate potential terminal $N_{n2}$ is almost equal to the low potential GND, substantially the potential of the low level power supply 106 is applied to the input of the internal power supply circuit 105 through the diode $D_1$. At the same time, the condenser $C_1$ is charged with electric charge, and the potential between the both electrodes of the condenser $C_1$ will be a value near the potential of the low level power supply 106.

(2) When the lower-side output power device $Q_{d2}$ is turned OFF and the upper-side output power device $Q_{u2}$ is turned OFF:

The potential of the intermediate potential terminal $N_{n2}$ is raised substantially to the high voltage. The input potential of the internal power supply circuit 105 is raised with the increase of the potential of the intermediate potential terminal $N_{n2}$ and the potential between both electrodes of the condenser $C_1$. Namely, the input of the internal power supply circuit 105 is biased by the potential between the two electrodes of the condenser $C_1$, i.e. the condenser $C_1$ acts as a power supply. Here, the input of the internal power supply circuit 105 is separated from the low level power supply 106 by the diode $D_1$. Thereafter, the condenser $C_1$ starts to discharge progressively, damping the input potential of the internal power supply circuit 105 progressively.

In the actual circuit, the capacitance of the condenser $C_1$ is selected so that the discharge time constant of the condenser $C_1$ be sufficiently larger than the alternative ON/OFF cycle of the upper-side output power device $Q_{u2}$ and the lower-side output power device $Q_{d2}$, to repeat the operation of the restitution of (1) state before the condenser 1 discharges completely for charging, and return to the state of (2). The displacement current $J_d$ by the parasitic condenser $C_{SUB}$ flows when the state changes from (1) to (2) as well as when the state changes from (2) to (1). However, the latter is less effective than the former, since the carriers sustaining the inversion layer are diminished by majority carriers in the latter. The former displacement current $J_d$ flowing when the state changes from (1) to (2) is mainly compensated by hole injection from the p injector region 242. These holes are not supplied by the internal power supply circuit 105, in the IC driver according to the first embodiment of the present invention.

As stated above, these holes never pass through the internal power supply circuit 105, and the required current for compensating the displacement current $J_d$ are fed to the inversion layer 4 through a by-pass diode $D_{bp}$ whose anode is connected to the intermediate potential terminal $N_{n2}$. As the consequence, the voltage drop of the internal power supply circuit due to the displacement current $J_d$, which was troublesome conventionally, will hardly occur, even in a simple circuit configuration as the internal power supply circuit 105 shown in FIG. 8. In other words, the use of small internal power supply circuit as shown in FIG. 8 allows minimization of the chip size. Moreover, a simple circuit as shown in FIG. 8 consumes less electric power, permitting easily to minimize the power dissipation of the driving circuit, and increasing the system power conversion efficiency. It should be remembered that FIG. 8 shows one of examples of the internal power supply circuit 105, and another simple circuit can also employed. Anyhow, as the result, a stable DI integrated circuit can be realized, which drives power devices having a high breakdown voltage or a high blocking voltage at high speed.

If the pMOS transistor $Q_{pp}$ is connected to a specific circuitry other than the internal power supply circuit 105, the fluctuation of the circuit parameters relating to the specific circuitry subjected to the displacement current $J_d$ is suppressed or minimized, since the displacement current $J_d$ can be easily compensated by the p injector region 242. Then the circuit parameters of the IC driver becomes unsusceptible to the displacement current $J_d$, and stable and reliable operation is always implemented.

The SOI structure shown in FIG. 7C may be formed using the Silicon Direct Bonding (SDB) method or by the combination of SDB method and Separation by IMplanted OXygen (SIMOX) method. It may also be formed by the epitaxial growth method. The thickness of the buried insulation film (SOI oxide film) is preferably 1 to 10 µm if it is fabricated by SDB method. For instance, it may be manufactured as follows employing the SDB method:

(a) As the supporting substrate 1, an n type silicon substrate of about $5\times10^{12}$ cm$^{-3}$ to $1\times10^{15}$ cm$^{-3}$ in impurity concentration and 250 to 600 nm thick is prepared. And a buried insulation film (SOI oxide film) 12 of 1 to 10 µm n thickness is formed on its surface by thermal oxidation method or CVD method or the like (and mirror polish the surface thereof if it is required). High pressure thermal oxidation method or the like may also be used to form a relatively thicker buried insulation film (SOI oxide film) 12 of about 3 µm or more in thickness.

(b) Next, an n⁻ type substrate (147, 148, 149, . . . ) having mirror polished surface may be mated with the p type silicon (supporting substrate) by sandwiching the SOI oxide film 12 between them. After the bonding by SDB method, the n⁻ type substrate (147, 148, 149, . . . ) may be adjusted to a desired thickness by grinding, polishing followed by etching. Then, the SOI substrate having the thickness of, for example, 1 to 30 µm is obtained.

(c) Next, a p injector region is formed at the same time as the p well forming process for arranging an nMOS transistor in it. For instance, $^{11}B^+$ ion is implanted by an acceleration voltage Vac=50 to 150 kV, dose amount of $1 \times 10^{12}$ to $5 \times 10^{13}$ cm$^{-2}$ and annealed to obtain a predetermined diffusion depth.

(d) Thereafter, an oxide film of 0.3 to 1 $\mu$m thick is formed on the surface of n$^-$ type substrate (147, 148, 149, . . . ) by the thermal oxidation method and a grid-like pattern as shown in FIG. 7B is formed on this oxide film 34 using the photolithography. The grid-like pattern may be formed by etching the oxide film by RIE method or by ECR etching method or the like, using CF$_4$ or the like as an etching gas, employing a photoresist film as an etching mask. Then, the photoresist film used for the oxide film etching is removed, and element isolation trenches are formed in the n type substrate (147, 148, 149, . . . ) by etching the n type substrate (147, 148, 149, . . . ) by RIE method, microwave plasma etching method or ECR etching method or the like, using CF$_4$+O$_2$, SF$_6$+O$_2$, SF$_6$+H$_2$, CCl$_4$ or SiCl$_4$ or the like as the etching gas, employing the oxide film mask as an etching mask. A couple of p injector regions may be formed respectively in the adjacent two semiconductor islands, by forming element isolation trenches in the center of the p injector region.

(e) Then, a trench side wall insulation film (oxide film) 6 is formed on the inner wall of the element isolation trench by the thermal oxidation method. Thereafter, the interior of the element isolation trench is filled by CVD method of non doped polycrystalline silicon, or oxygen doped polycrystalline silicon (Semi-Insulating Polycrystalline silicon: SIPOS) or the like. Then the surface is flattened by Chemical Mechanical Polishing (CMP) or the like, so that the polycrystalline silicon or the like is buried, forming the element isolation region. Silicon oxide (SiO$_2$) film, silicon nitride film (Si$_3$N$_4$) or other insulator film is also employed to bury the interior of the element isolation trench.

(f) Thereafter, a predetermined semiconductor device such as pMOS transistor, nMOS transistor, or bipolar transistor may be formed by a IC fabrication process such as a standard MOS fabrication process or BiCMOS fabrication process. These IC fabrication processes are well known in the art and will not be described herein.

In the description above, the p injector region is formed at the same time as the p well formation process; however, a heavily doped p injector region of about $5 \times 10^{17}$ cm$^{-3}$ to $1 \times 10^{20}$ cm$^{-3}$ in impurity concentration may also be formed by a single process. The formation of the heavily doped p injector region can increase the injection efficiency of carrier constituting the displacement current component flowing in the parasitic condenser. A process flow where the p injector region is formed after the formation of the element isolation region may also be adopted.

In the IC driver according to the first embodiment of the present invention, when a bias is applied, the displacement current $J_d$ flows, first, by the expanding upward the depletion layer from the buried insulation film 12 surface and depleting the electrons. When the bias increases further creating a condition to produce a p inversion layer 4 over the buried insulation film 12, as shown in FIG. 7C, and holes (h$^+$) will be injected from the p injector region. If the depletion layer does not reach the p injector region 24, holes (h$^+$) will be injected only when biased by the built-in potential between the p-n junction. Therefore, in principle, the p injector region 242 when deeper is more effective for hole supply.

Figure 9A:
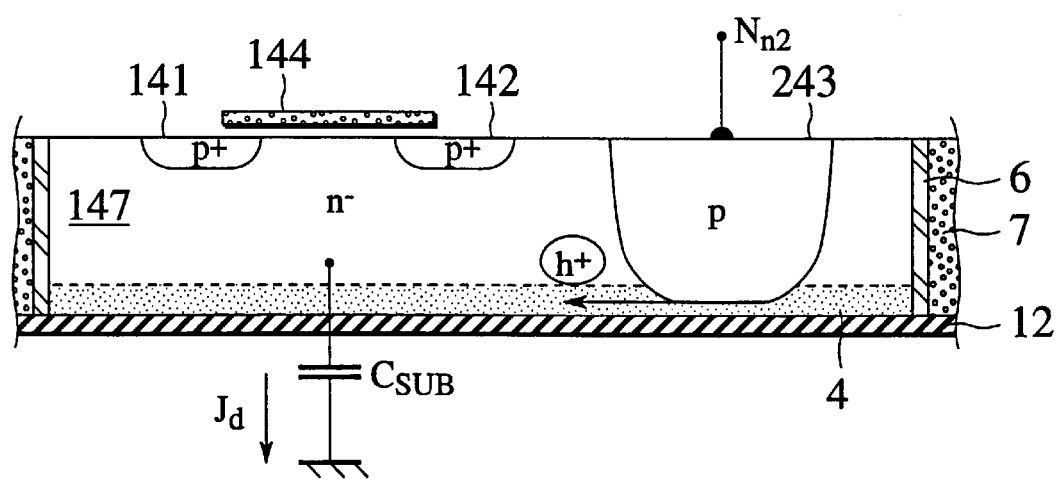
FIG. 9A is a partial schematic diagram of the IC driver according to a variant of the first embodiment of the present invention.

In an extreme example, the bottom of the p injector region reaches to the buried insulation film (SOI oxide film) 12. When it is biased to a state where the inversion layer 4 is produced on the SOI oxide film 12 by the potential of the supporting substrate 1, holes will be supplied immediately from the p injector region 242. FIG. 9A shows, in an SOI structure where an n type semiconductor island 147 is formed on the supporting substrate 1 sandwiching the SOI oxide film (the buried insulation film) 12 between them, and the p injector region 243 is formed so deep to penetrate substantially the n type semiconductor island 147 (However, in FIG. 9A, the p injector region 243 does not reach perfectly to the buried insulation film 12). Similarly to FIG. 7C, the pMOS transistor shown in FIG. 9A comprises a p$^+$ source region (first main electrode region) 141, a p$^+$ drain region 142 (second main electrode region) disposed in the n type semiconductor island 147 and a doped polycrystalline silicon gate electrode 144. For an expert who understands the above discussion, it may be obvious that it is preferable to form the p injector region 243 deep enough so that the bottom of the p injector region 243 reaches the buried insulation film 12. In the case that the p injector region 243 is formed deep enough, the extension of the depletion layer from the bottom will reach immediately to the p injector region 243. When the depletion layer reaches to the p injector region 243, an "influx" will occur in place of "injection" mentioned above. It is same as the influx of carrier to inversion layer from the source of the MOS transistor. Therefore, the inversion layer is formed more rapidly than the injection mentioned above, and its carrier supply source will have the intermediate potential, making the internal power supply circuit 105 more stable if the pMOS transistor shown in FIG. 9A is connected to the internal power supply circuit 105.

If the pMOS transistor shown in FIG. 9A is connected to a specific circuitry other than the internal power supply circuit 105, the fluctuation of the circuit parameters relating to the specific circuitry subjected to the displacement current $J_d$ is suppressed or minimized, since the displacement current $J_d$ can be easily compensated by the p injector region 242. Then the circuit parameters of the IC driver becomes unsusceptible of the displacement current $J_d$, and stable and reliable operation is always implemented.

Figure 9B:
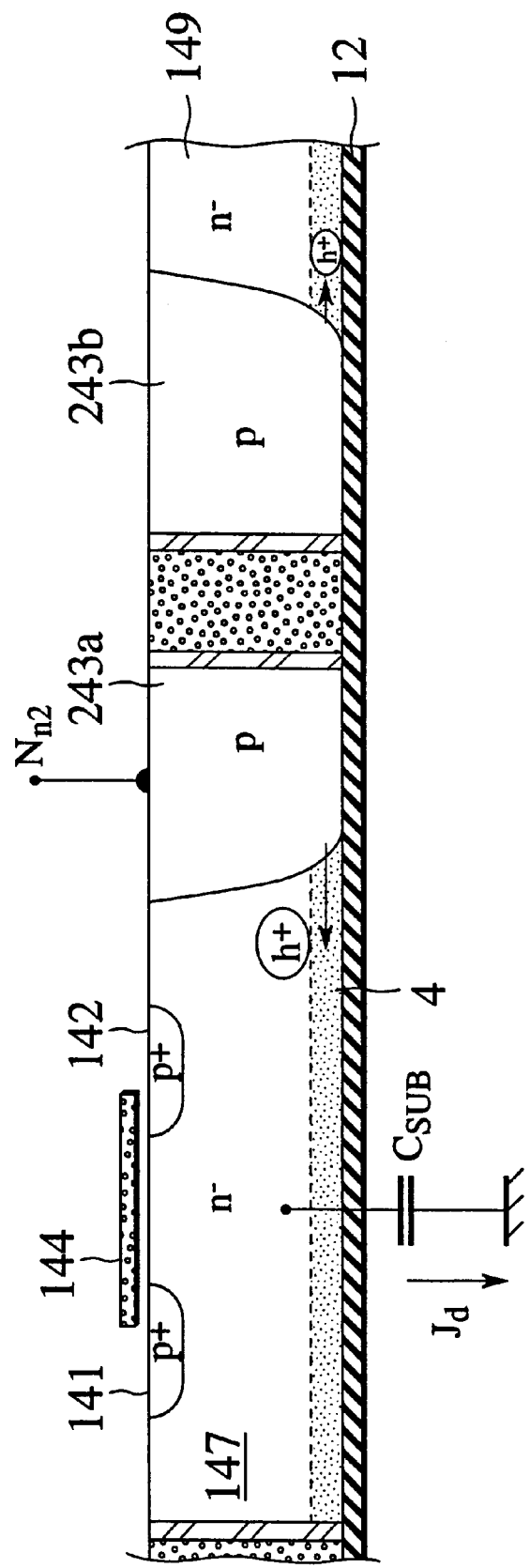
FIG. 9B is a partial schematic diagram of the IC driver according to another variant of the first embodiment of the present invention.
Figure 9C:
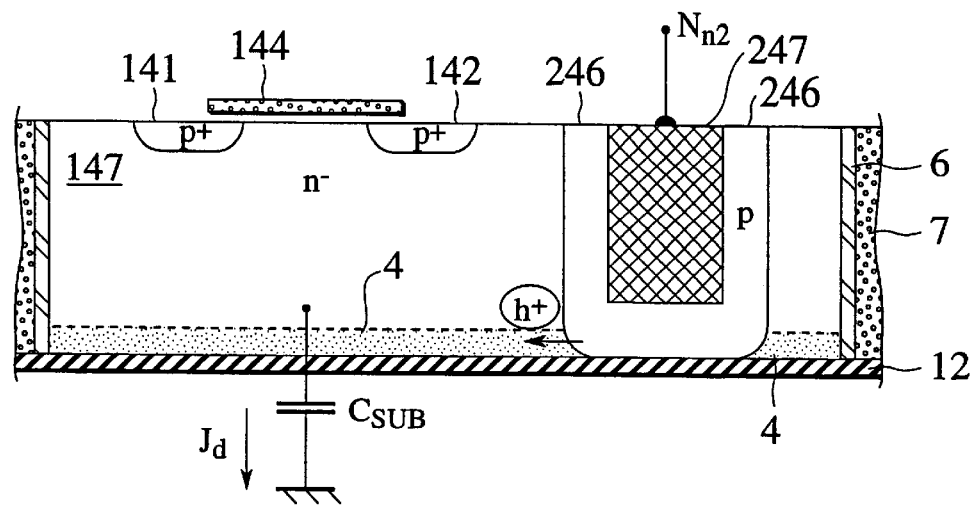
FIG. 9C is a partial schematic diagram of the IC driver according to still another variant of the first embodiment of the present invention.

FIGS. 9B–9C show the case where the bottom of the p injector region reaches to the buried insulation film (SOI oxide film) 12. In FIG. 9B, the p injector region 243a touches a trench side wall insulation film (oxide film) 6. In other words, the trench is formed in the center of two p injector region 243a and 243b to improve the surface layout efficiency. As well-known in the art, during impurity atoms diffusing thermally in depth direction of semiconductor region, these impurity atoms diffuses laterally 70 to 80% of the vertical diffusion depth at the same time. As a consequence, if n type semiconductor island 147 is sufficiently thick, the impurity atoms in the p injector region 243a will diffuse laterally to occupy a large area during the thermal diffusion process for forming the p injector region, whose bottom is designed to reach the buried insulation film (SOI oxide film) 12. If we don't want to make a large lateral area for the p injector region, a diffusion trench may be formed first, and then the impurity atoms are diffused from the side wall (and the bottom wall) of this trench, and, as shown in FIG. 9C, a p injector region 246 may be formed by relatively shallow lateral diffusion. After impurity diffusion, as shown in FIG. 9C, the interior of the trench may be filled with conductive material 247 composed of doped polycrystalline silicon or refractory metal such as tungsten (W), titan (Ti), molybdenum (Mo) or the like. Thus, a p injector region 246 having a high aspect ratio and low resistance, with a small occupation area can be formed easily. The conductive material 247 may include silicides of these refractory metals (WSi$_2$, TiSi$_2$, MoSi$_2$) or the like, or polycides using these silicides. The conductive material 247 may be formed so deep that the bottom of the conductive material 247 may reach to the buried insulation film (SOI oxide film) 12. As shown in FIGS. 9B and 9C, the formation of deeper p injector region 243a, 246 makes the depletion layer always in contact with the p injector region 243a, 246, and the inversion layer 4 is formed immediately, allowing the carrier to "flow into" the inversion layer 4 just under the depletion layer, resulting in a more stable internal power supply circuit 105, if the pMOS transistor shown in FIGS. 9B and 9C is connected to the internal power supply circuit 105. If the pMOS transistors shown in FIGS. 9B and 9C are connected respectively to specific circuitry other than the internal power supply circuit 105, the fluctuation of the circuit parameters relating to the specific circuitry subjected to the displacement current $J_d$ is suppressed or minimized, since the displacement current $J_d$ can be easily compensated by the p injector region 242. Then the circuit parameters of the specific circuitry become immune to the displacement current $J_d$, and stable and reliable operations are always implemented.

Figure 9D:
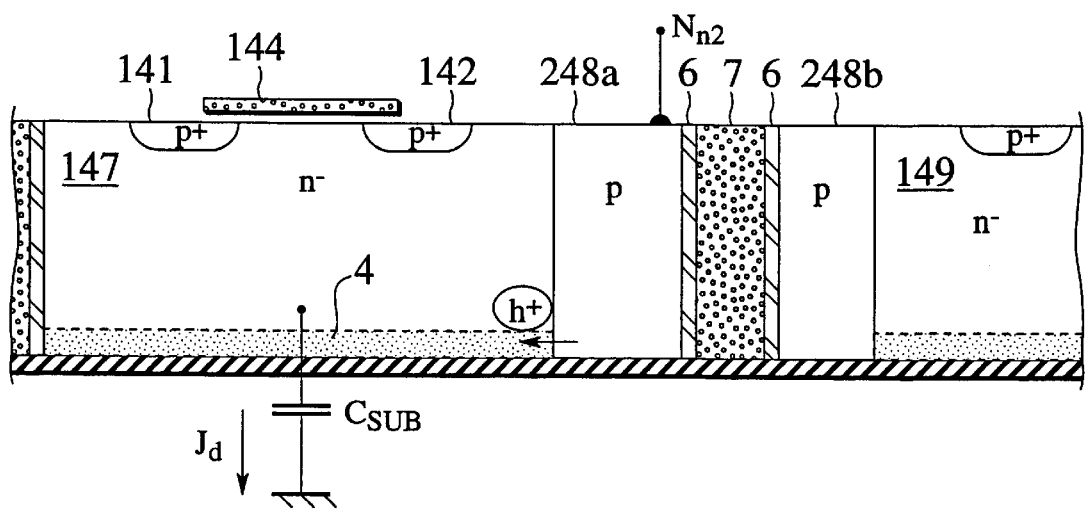
FIG. 9D is a partial schematic diagram of the IC driver according to still another variant of the first embodiment of the present invention.

FIG. 9D shows a structure where a diffusion trench is formed, and impurity atoms are diffused laterally from the side wall of this diffusion trench so as to form p injector region 248a, 248b, and thereafter, an element isolation trench is formed penetrating the place where the diffusion trench is provided beforehand. As shown in FIG. 9D, the formation of deeper p injector region 248a, 248b forms the inversion layer immediately, allowing the carrier to flow into the inversion layer, resulting in a more stable internal power supply circuit 105.

The IC driver comprising the deep p injector region 248a, 248b presenting a high aspect ratio, as shown in FIG. 9D can be manufactured by the method illustrated in a sequence of the process plan views and process cross-sectional views of FIGS. 10A to 15B.

Figure 10A:
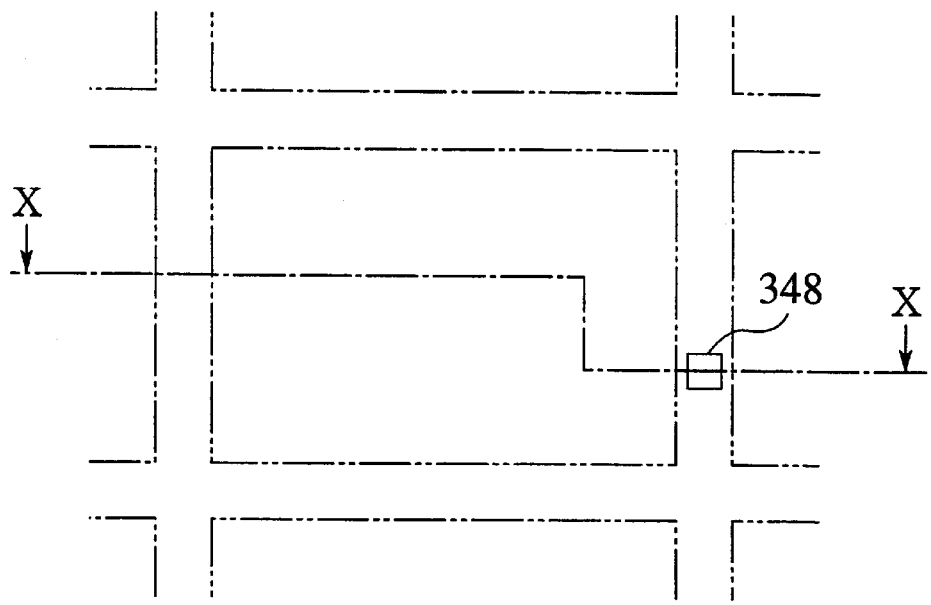
FIG. 10A is a process plan view of the IC driver shown in FIG. 9D.
Figure 10B:
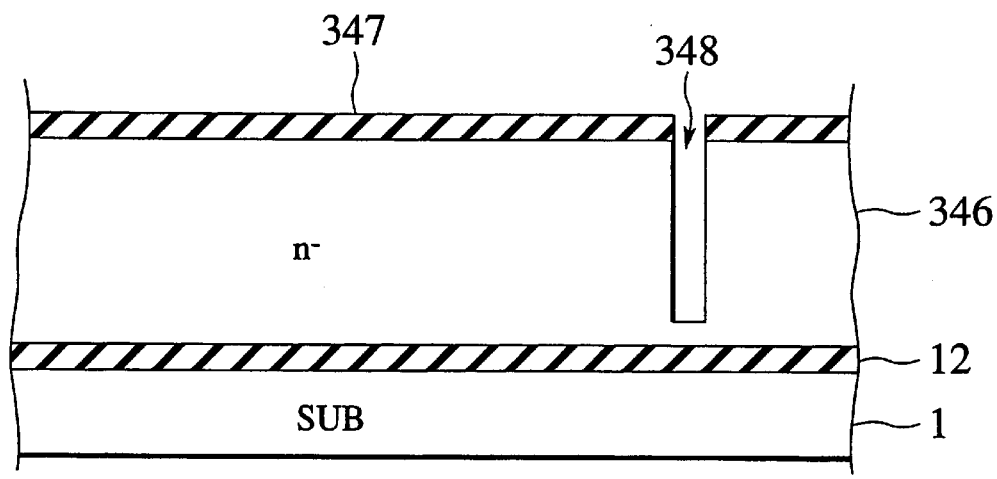
FIG. 10B is a process cross-sectional view along X—X of FIG. 10A.

(a) First, as mentioned above, an n type substrate 346 of 10 to 50 μm in thickness is formed on the supporting substrate 1 sandwiching the buried insulation film (SOI oxide film) 12 by the SDB method or the like. Moreover, an oxide film 347 of 0.3 to 1 μm in thickness is formed on the surface of the n type substrate 346, by thermal oxidation method, and a rectangular opening as shown in FIG. 10A is formed on a part of this oxide film 347 using the photolithography method. This rectangular opening may be formed by etching the oxide film 347 by RIE method using photoresist film as mask, or by ECR etching method or the like. Then, the photoresist film used for the etching of the oxide film 34 is removed, and an element isolation trench 348 is formed, as shown in FIG. 10B, by etching by RIE method using the oxide film 347 as mask. The diffusion trench 347 may reach to the buried insulation film (SOI oxide film) 12, or may leave a portion of n type substrate 346 of 1 to 2 μm in thickness at the bottom. FIG. 10B is a process cross-sectional view along X—X of FIG. 10A.

Figure 11A:
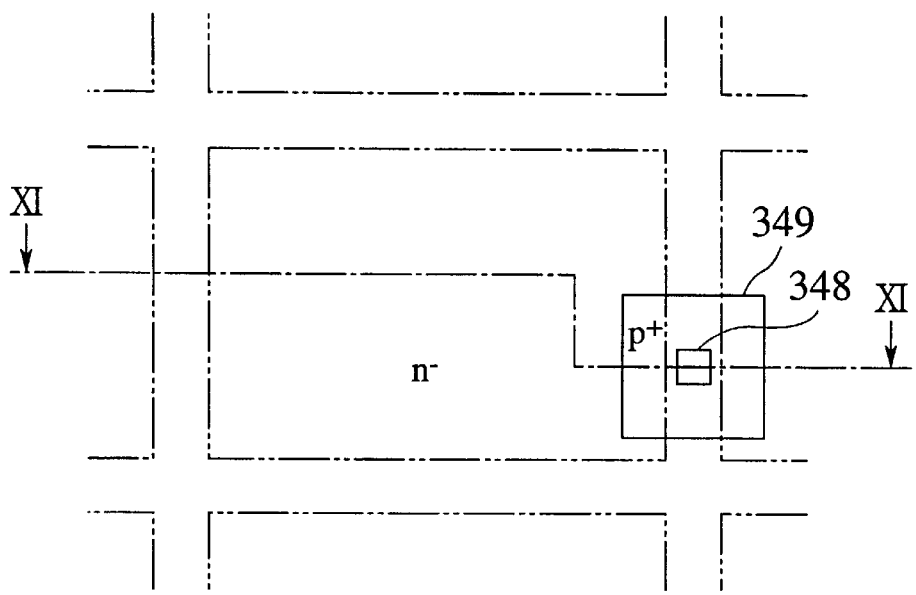
FIG. 11A is a process plan view of the IC driver shown in FIG. 9D.
Figure 11B:
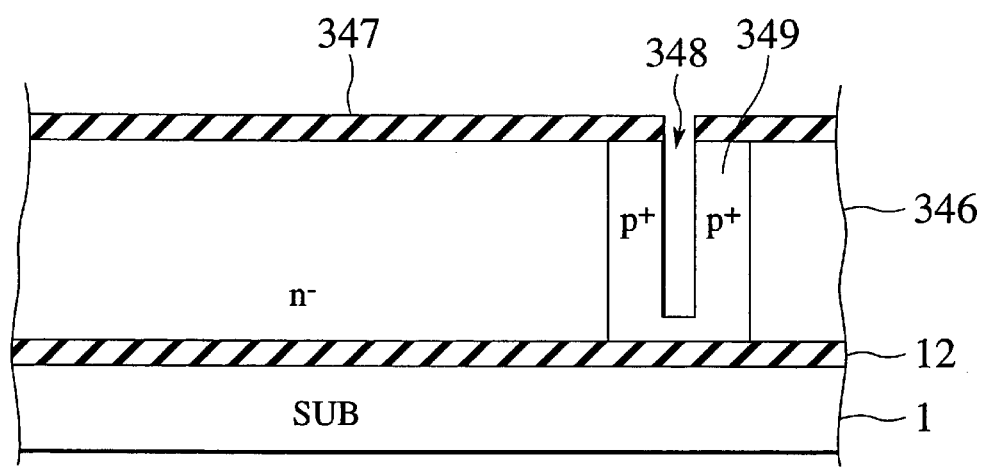
FIG. 11B is a process cross-sectional view along XI—XI of FIG. 11A.

(b) Next, from the side wall and the bottom of this diffusion trench 348, vapor phase diffusion (pre-deposition) using solid source such as BN or liquid source such as BBr$_3$ is performed; then heat treatment is applied to attain the predetermined diffusion depth as shown in FIGS. 11A and 11B, to form a p injector region 349. FIG. 11B is a process cross-sectional view along XI—XI of FIG. 11A.

Figure 12A:
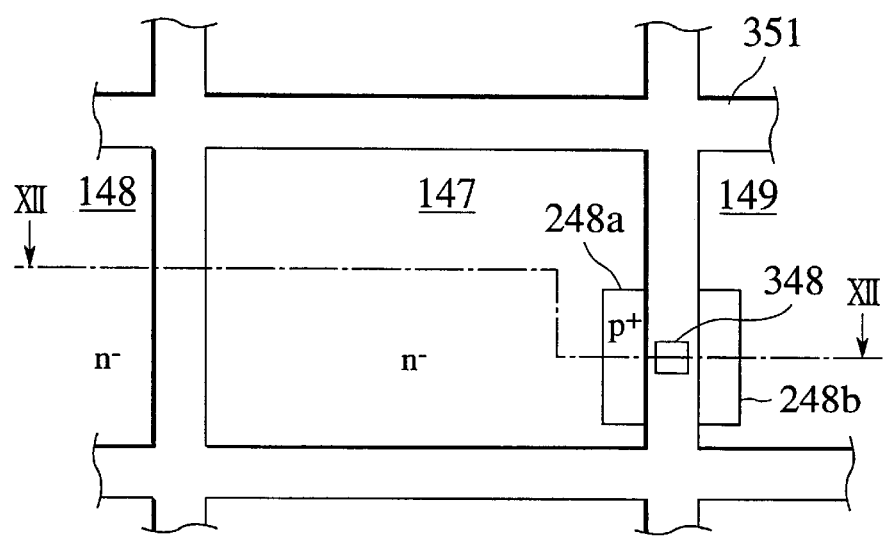
FIG. 12A is a process plan view of the IC driver shown in FIG. 9D.
Figure 12B:
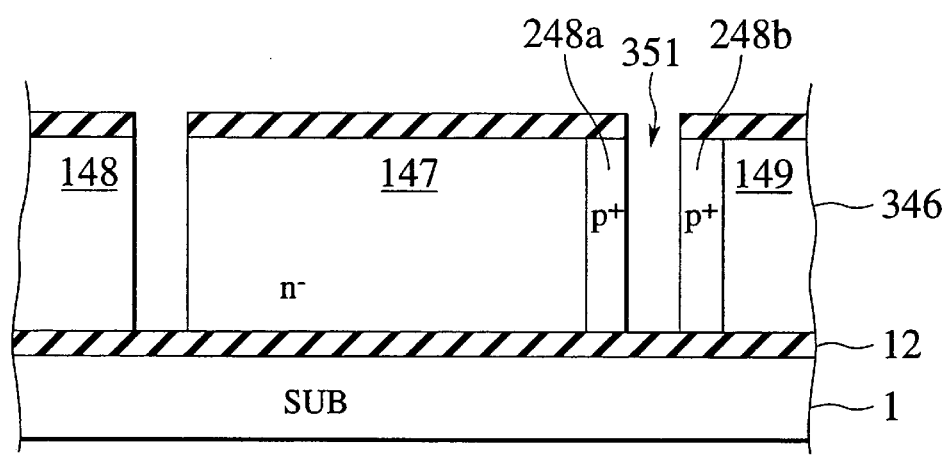
FIG. 12B is a process cross-sectional view along XII—XII of FIG. 12A.

(c) Then a grid like pattern as shown in FIG. 12A is formed on this oxide film 347 using the photolithography. The grid like pattern may be formed by etching the oxide film 347 by RIE method, or by ECR etching method or the like, using photoresist film as mask. Then, the photoresist film used for etching the oxide film 347 is removed, and an element isolation trench 351 is formed in the n type substrate 346 by etching the n type substrate 346 by RIE method or the like. As the result, p injector regions 248a, 248b may be formed respectively in the adjacent two semiconductor islands 147, 149, by forming an element isolation trench 351 in the center of a p injector region 349. FIG. 12A is a process plan view of the IC driver shown in FIG. 9D, and FIG. 12B is a process cross-sectional view along XII—XII of FIG. 12A.

Figure 13A:
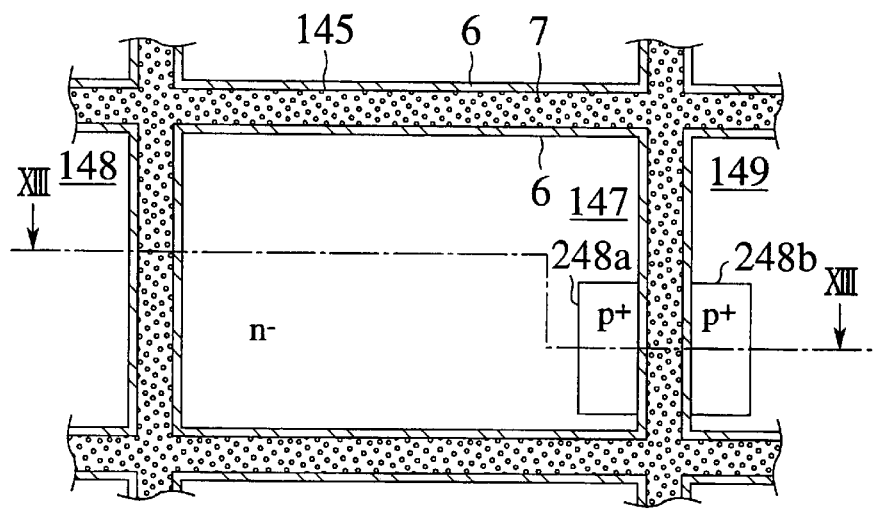
FIG. 13A is a process plan view of the IC driver shown in FIG. 9D.
Figure 13B:
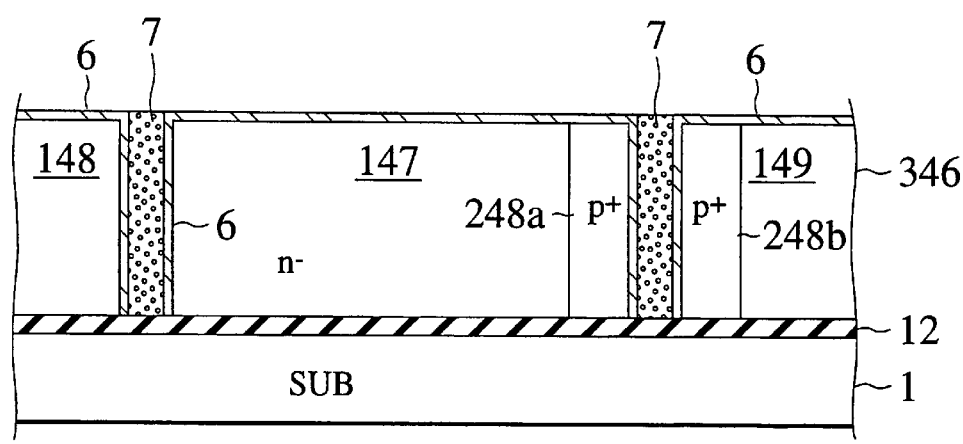
FIG. 13B is a process cross-sectional view along XIII—XIII of FIG. 13A.

(d) Then, a trench side wall insulation film (oxide film) 6 is formed by thermal oxidation method on the inner wall of the element isolation trench, as shown in FIGS. 13A and 13B. FIG. 13B is a process cross-sectional view along XIII—XIII of FIG. 13A. Thereafter, the interior of the element isolation trench is filled by depositing non doped polycrystalline silicon, or oxygen doped polycrystalline silicon (Semi-Insulating Polycrystalline silicon: SIPOS) or the like by CVD method, the surface is flattened by CMP method or the like, and trench filling polycrystalline silicon 7 is embedded to form the element isolation region.

Figure 14A:
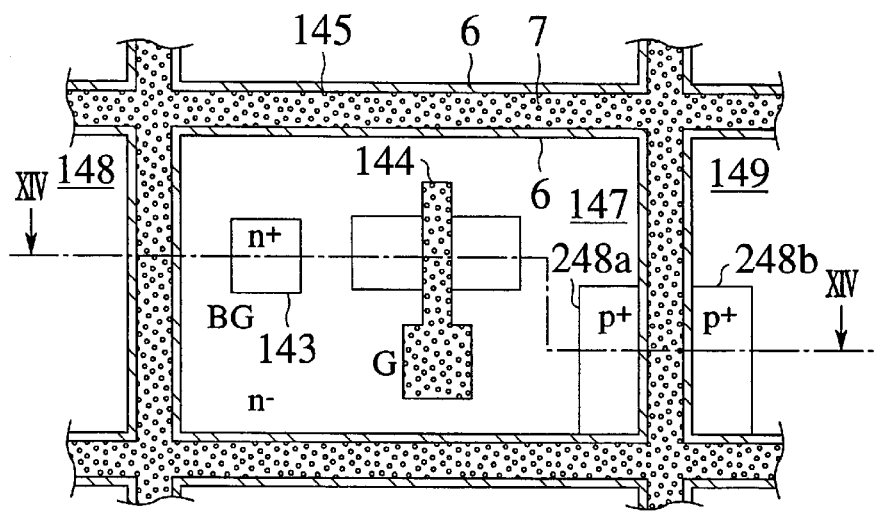
FIG. 14A is a process plan view of the IC driver shown in FIG. 9D.
Figure 14B:
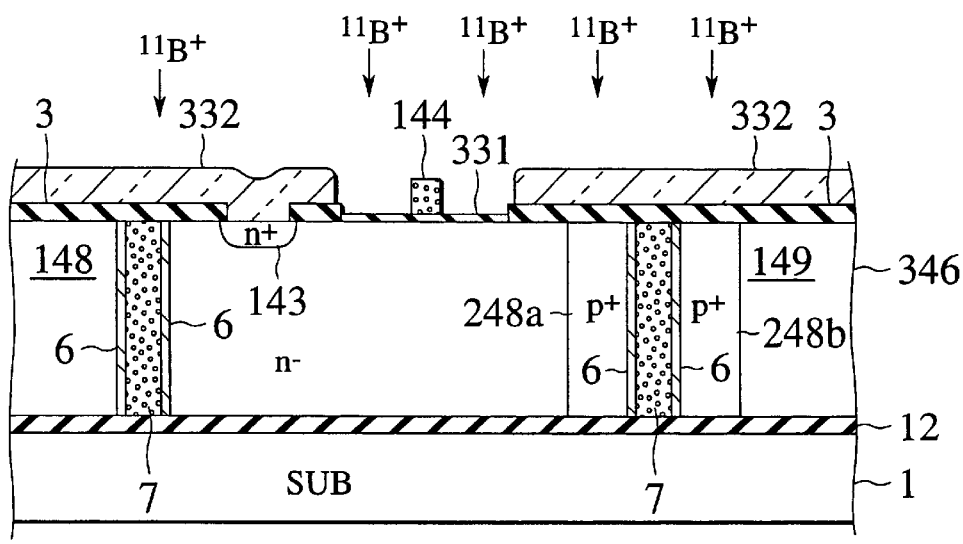
FIG. 14B is a process cross-sectional view along XIV—XIV of FIG. 14A.

(e) Thereafter, a silicon nitride film (Si$_3$N$_4$) is formed all over the surface of the semiconductor island 147 and then selectively removed except for the device formation area and the specific surface section where n$^+$ substrate contact region 143 is scheduled to be formed, using photolithography method. A field oxide film 3 is formed on the semiconductor island 147 by thermal oxidation method using this nitride film as mask. Field oxide film 3 will not be formed on the device formation area and the specific section where n$^+$ substrate contact region 143 is scheduled to be formed. After the removal of nitride film, a gate oxide film 331 is formed on the device formation area and the specific section where n$^+$ substrate contact region 143 is scheduled to be formed. Then about 400 nm of polycrystalline silicon film is deposited all over the gate oxide film 331 by CVD method. A photoresist film is spin- coated on the polycrystalline silicon film, followed by the patterning of the photoresist film by the photolithography method. Then a gate electrode is formed by etching the polycrystalline silicon film by RIE or others, as shown in FIGS. 14A and 14B, using this photoresist film as mask. FIG. 14B is a process cross-sectional view along XIV—XIV of FIG. 14A. Thereafter, the photoresist film is removed. Next, the device formation area or others are covered with a new photoresist film and arsenic (As) is ion implanted into the specific section where n$^+$ substrate contact region 143 is scheduled to be formed by the order of dose amount of $10^{15}$ cm$^{-2}$ (arsenic (As) is also ion implanted into nMOSFET source/drain regions). Then, as shown in FIGS. 14A and 14B, n$^+$ substrate contact region 143 and nMOSFET source/drain regions are covered with still another photoresist film 332. There, boron (B) is implanted by the order of dose amount of $10^{15}$ cm$^{-2}$ by the self-alignment technology, using the polycrystalline silicon gate 144 as mask. At this time, boron (B) is also ion implanted into the polycrystalline silicon gate 144. Thereafter, the photoresist film 332 will be removed.

Figure 15A:
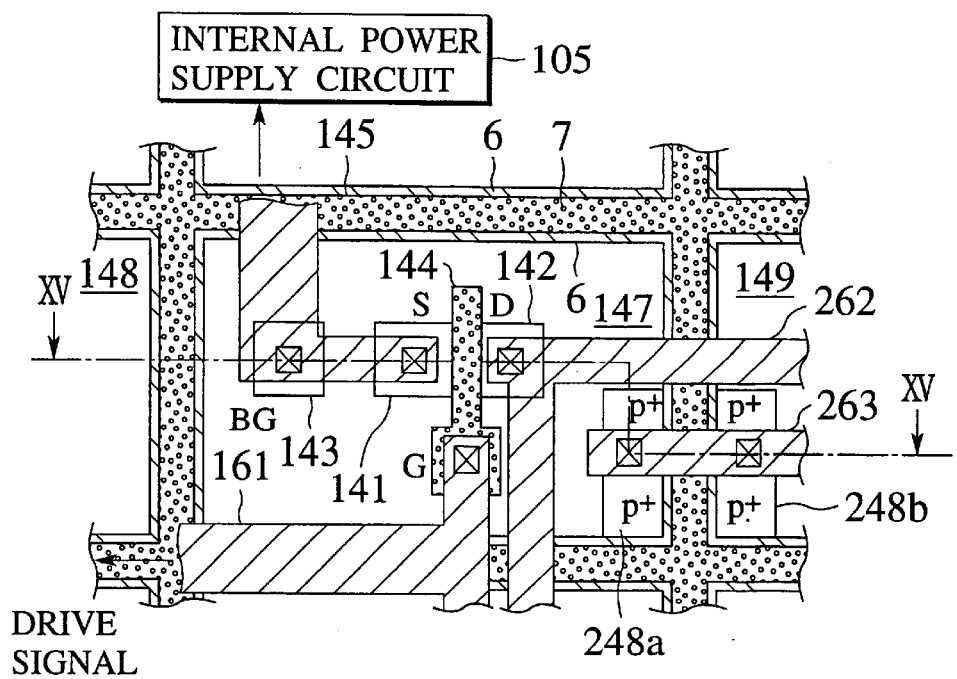
FIG. 15A is a process plan view of the IC driver shown in FIG. 9D.
Figure 15B:
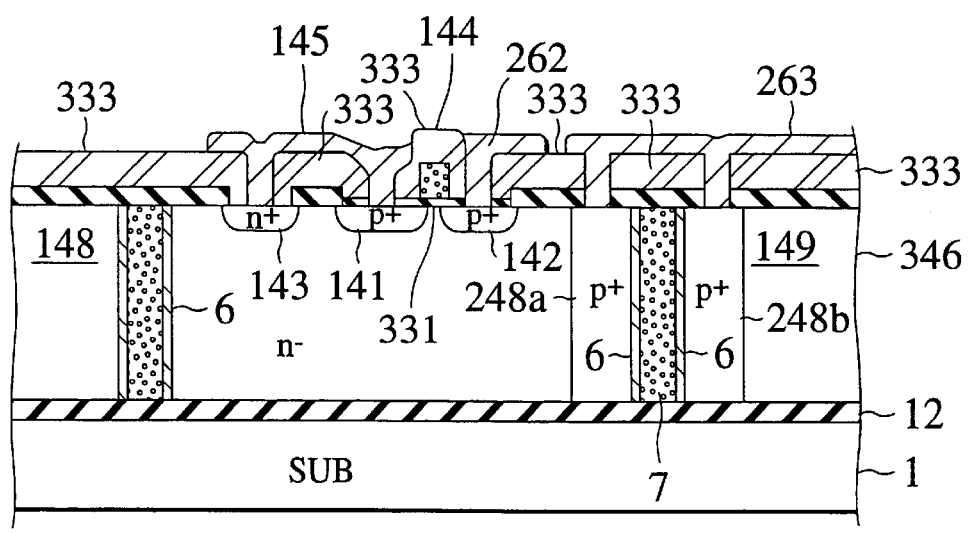
FIG. 15B is a process cross-sectional view along XIV—XIV of FIG. 15A.

(f) Then n type semiconductor island 147 is annealed, to diffuse impurity atoms up to a predetermined depth by this heat treatment, and to form p$^+$ source region 141, p$^+$ drain region 142 and n$^+$ substrate contact region 143, as shown in FIGS. 15A and 15B. FIG. 15B is a process cross-sectional view along XIV—XIV of FIG. 15A. At that time, the resistivity of the polycrystalline silicon gate 144 is lowered, as the boron (B) implanted in the polycrystalline silicon gate 144 is also activated. Next, an interlayer insulation film 333 is deposited. The interlayer insulation film 333 is etched on this surface by RIE or ECR ion etching or the like, using as mask the photoresist film patterned by photolithography, to form a contact hole. Thereafter, the photoresist film used for the formation of this contact hole is removed and an aluminum alloy film (Al—Si, Al—Cu—Si) is formed by spattering method or electron beam evaporation method or the like. Mask of photoresist film is formed thereon using photolithography method and metallic wiring 145, 161, 262, 263 is formed to complete an IC driver having the high aspect ratio and deep p injector region 248a, 248b.

Figure 16:
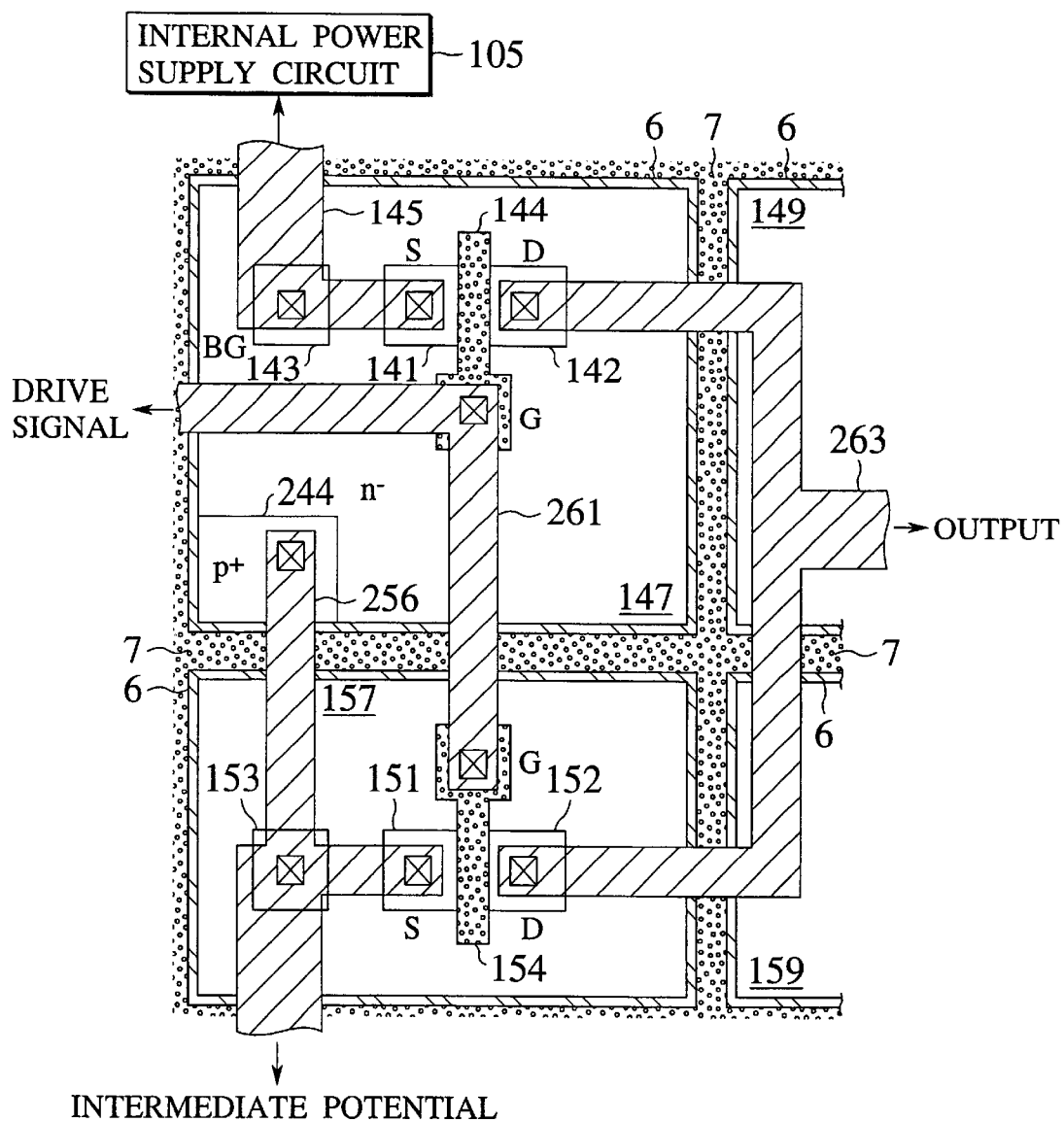
FIG. 16 is a partial schematic diagram of the IC driver according to still another variant of the first embodiment of the present invention.

FIG. 16 is a partial schematic diagram of an IC driver according to a variant of the first embodiment of the present invention, wherein the position of the p injector region 244 is different from that of FIG. 7B. The p injector region 244 is connected to the intermediate potential terminal $N_{n2}$ via a metallic wiring 256. This metallic wiring 256 of this intermediate potential connects also the $p^+$ substrate contact region 153 disposed in the p type semiconductor island 157 and the $n^+$ source region 151 to each other. In the n type semiconductor island 147, an $n^+$ substrate contact region 143 is formed, and $n^+$ substrate contact region 143 and the $p^+$ source region are connected to each other, by the metallic wiring 145 from the internal power supply circuit 105, as in FIG. B. Further, a metallic wiring 261 is connected to doped polycrystalline silicon gate electrodes 144, 145 composing the CMOS inverter 111 shown in FIG. 16, and the drive signal is input through this metallic wiring 261. And, pMOS transistor $p^+$ drain region 142 and nMOS transistor $n^+$ drain region 152 are connected to each other by the metallic wiring 263, and the wiring 263 is connected to the gate of the upper-side output power device. Thus, p injector region can be disposed in an arbitrary position in the $n^-$ type semiconductor island 147 surrounded by element isolation regions (6, 7), or in a "vacant space", and it is unnecessary to enlarge particularly the space of the $n^-$ type semiconductor island 147.

The p injector region can be disposed in the perimeter of the $n^-$ type semiconductor island 147, or at the boundary between the $n^-$ type semiconductor island 147 and the side wall of element isolation trench so as to surround the $n^-$ type semiconductor island 147. The p injector region disposed in perimeter of the $n^-$ type semiconductor island 147 can be formed as follows:

(a) Similar to the aforementioned manufacturing process, the grid-like element isolation trench is formed in the SOI substrate to form a plurality of semiconductor islands by RIE, microwave plasma etching or ECR etching method or the like.

(b) Next, from the side wall and the bottom of the grid-like element isolation trench, the vapor phase diffusion (pre-deposition) using the solid source such as BN or the liquid source such as $BBr_3$ is conducted. Instead of the vapor phase diffusion (pre-deposition), multi-time oblique ion implantations of $^{11}B^+$ or $^{49}BF_2^+$ can be applied through the enclosing four sidewalls of the grid-like element isolation trench. That is, one of the sidewall (first sidewall) of the grid-like element isolation trench is ion-implanted at a predetermined oblique angle. Next, the opposing sidewall (second sidewall) of the grid-like element isolation trench is ion-implanted at another predetermined oblique angle. Then, another sidewall (third sidewall) perpendicular to the couple of the sidewalls (first and second sidewalls) of the grid-like element isolation trench is ion-implanted at still another predetermined oblique angle. And, finally the opposing sidewall (fourth sidewall) to the third sidewall is ion-implanted at further still another predetermined oblique angle. In fact, if we rotate the SOI substrate around the central axis perpendicular to the surface of the SOI substrate, all of four predetermined oblique angles can be attained by a single oblique angle. Anyhow, after the pre-deposition or the oblique ion implantation, a heat treatment is applied to attain the predetermined diffusion depth. Then p injector regions may be formed respectively in the perimeter of semiconductor islands.

(c) Then, the trench side wall insulation film is formed on the inner wall of the grid-like element isolation trench by the thermal oxidation method. From here the same manufacturing process already mentioned can be employed.

(SECOND EMBODIMENT)

Figure 17A:
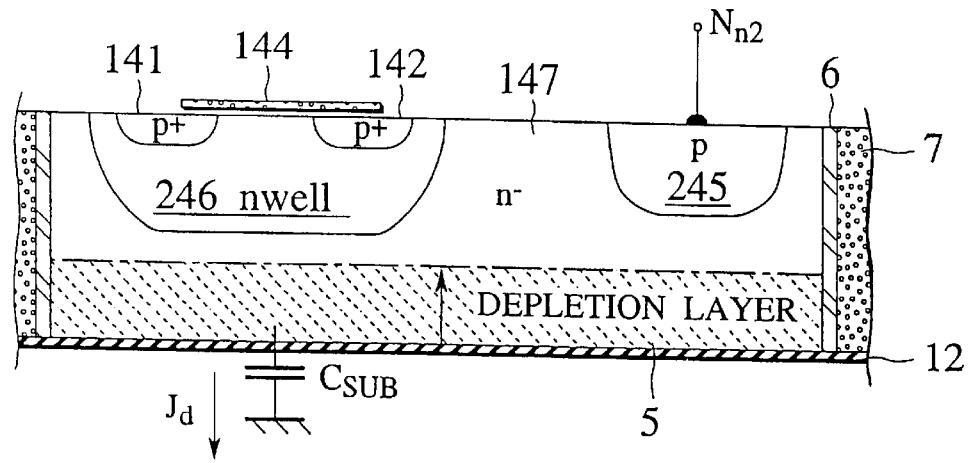
FIGS. 17A to 17C are partial cross-sectional views illustrating the potential (intermediate potential) dependency of the neutral point terminal $N_{n2}$ of the IC driver according to a second embodiment of the present invention.
Figure 17B:
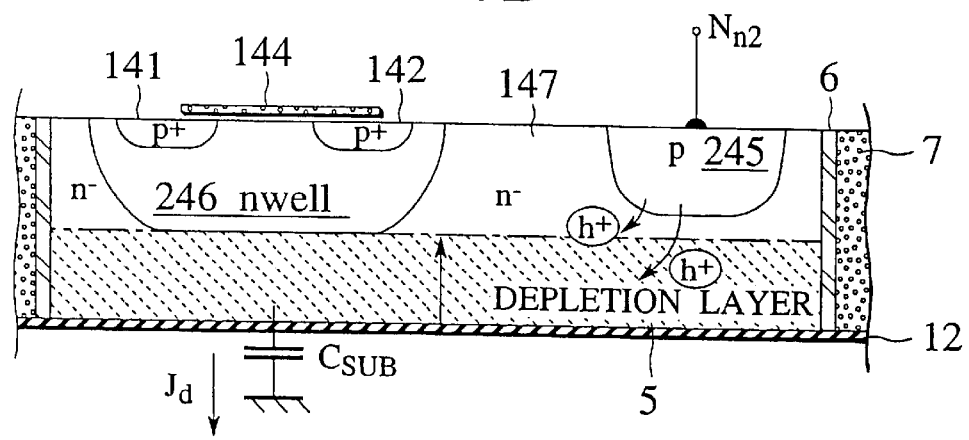
Figure 17C:
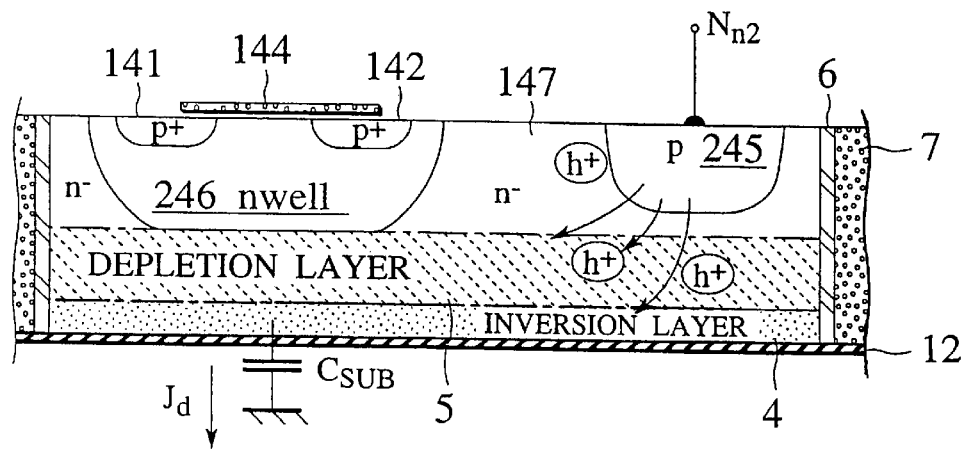

FIGS. 17A to 17C are partial cross-sectional views illustrating the variation of the depletion layer width in accordance with the variation of the potential (intermediate potential) at the intermediate potential terminal $N_{n2}$ of the IC driver according to a second embodiment of the present invention. As shown in FIGS. 17A to 17C, the IC driver according to the second embodiment of the present invention comprises at least semiconductor island ($n^-$ type semiconductor island) 147 separated by the bottom dielectric film 12 and the side dielectric film 6, a switching device in a floating state (pMOS transistor) disposed in this $n^-$ type semiconductor island 147, and an injector region 245 disposed in the $n^-$ type semiconductor island 147, at a position separated from the switching device, for injecting carriers having conduction type identical to that of the carrier constituting the main current of the switching device. Namely, FIGS. 17A to 17C are cross-sectional views of the pMOS transistor constituting the output stage CMOS inverter of the upper-side driver.

Similar to the IC driver according to the first embodiment of the present invention shown in FIG. 7C, the SOI structure of the second embodiment has the $n^-$ type semiconductor island 147 formed on the supporting substrate 1 sandwiching the SOI oxide film (buried insulation film) 12 between them, but the supporting substrate 1 is not illustrated in FIGS. 17A to 17C. The SOI structure is illustrated symbolically by a parasitic condenser $C_{SUB}$ composed similarly of an SOI oxide film (buried insulation film) 12, an $n^-$ type semiconductor island 147 and a back electrode 2 (refer to FIG. 7C).

The basic circuit configuration of the IC driver according to the second embodiment of the present invention is similar to FIG. 6; however, as shown in the cross-sectional views of FIGS. 17A to 17C, an n well 246 is disposed in the $n^-$ type semiconductor island 147, and a pMOS transistor is formed therein. In other words, a $p^+$ source region (first main electrode region) 141 and a $p^+$ drain region 142 (second main electrode region) are disposed in the n well 246. On the other hand, a p injector region 245 is deeply formed, at the depth almost same as the n well 246, at a position separated from the n well 246 of the $n^-$ type semiconductor island 147. Though it is not illustrated, an $n^+$ substrate contact region is disposed in the n well 246, and the $n^+$ substrate contact region and the $p^+$ source region 141 are connected to each other, through a metallic wiring from the internal power supply circuit. The internal power supply circuit is a simple circuit of bootstrap design as shown in FIG. 8. When the potential (intermediate potential) of the intermediate potential terminal $N_{n2}$ rises, the potential of the $n^+$ substrate contact region and the $p^+$ source region 141 goes up to the high voltage.

FIG. 17B represents a case where the intermediate potential is higher than FIG. 17A; when the intermediate potential increases, the depletion layer 5 from the SOI oxide film (buried insulation film) 12 extends upward into the $n^-$ type semiconductor island 147 in the floating state. In the second embodiment of the present invention, the enlargement of the depletion layer width extending from SOI oxide film 12 is stopped at the position where the top of the depletion layer 5 reaches to the bottom of the n well 246 as shown in FIG. 17B, and the depletion layer 5 cannot reach the p+ source region 141.

Even when the intermediate potential further increases more than that of FIG. 17B, the extension of the depletion layer 5 remains unchanged at the position of the bottom of the n well 246. FIG. 17C represents a case where the intermediate potential is still higher than that of FIG. 17B, but as in FIG. 17B, the extension of the depletion layer 5 is held at the position of the bottom of the n well 246. However, if the intermediate potential increases further higher, holes are accumulated in the n− type semiconductor island 147 at bottom in proximity of the SOI oxide film 12, forming a p inversion layer 4. Thus, though the extension of the depletion layer 5 remains at the position of the bottom of the n well 246, the p inversion layer 4 is formed under the depletion layer 5; and in this state, if the potential differential between the p injector region 245 and the ground potential (GND), to be more precise, the potential difference between the p injector region 245 and the n− semiconductor island 147 exceeds the built-in potential (of, for example, 0.6–0.7 Volts) between the p injector region 245 and the n− semiconductor island 147, hole are injected from the p injector region 245 into the depletion layer 5 through the n− semiconductor island 147 and, further, to its inferior portion through the depletion layer 5, in a way to suppress the output variation of the internal power supply circuit.

Thus, in the IC driver according to the second embodiment of the present invention, this displacement current $J_d$ flowing through the parasitic condenser $C_{SUB}$ is mainly supplied by hole injection from the p injector region 242. As the consequence, the voltage drop of the internal power supply circuit due to the displacement current $J_d$, which was annoying conventionally, will hardly occur, even in a simple circuit configuration as shown in FIG. 8. In other words, it allows minimization of the internal power supply circuit, namely to minimize the chip size. Moreover, such a simple circuit consumes less electric energy, permitting easily to decrease the power dissipation of the driving circuit, and increase the system power conversion efficiency. As the result, a stable DI integrated circuit, or the IC driver for driving the output power devices having the high breakdown voltages or high blocking voltages, which can operate at high speed, can be realized.

(THIRD EMBODIMENT)

Figure 3:
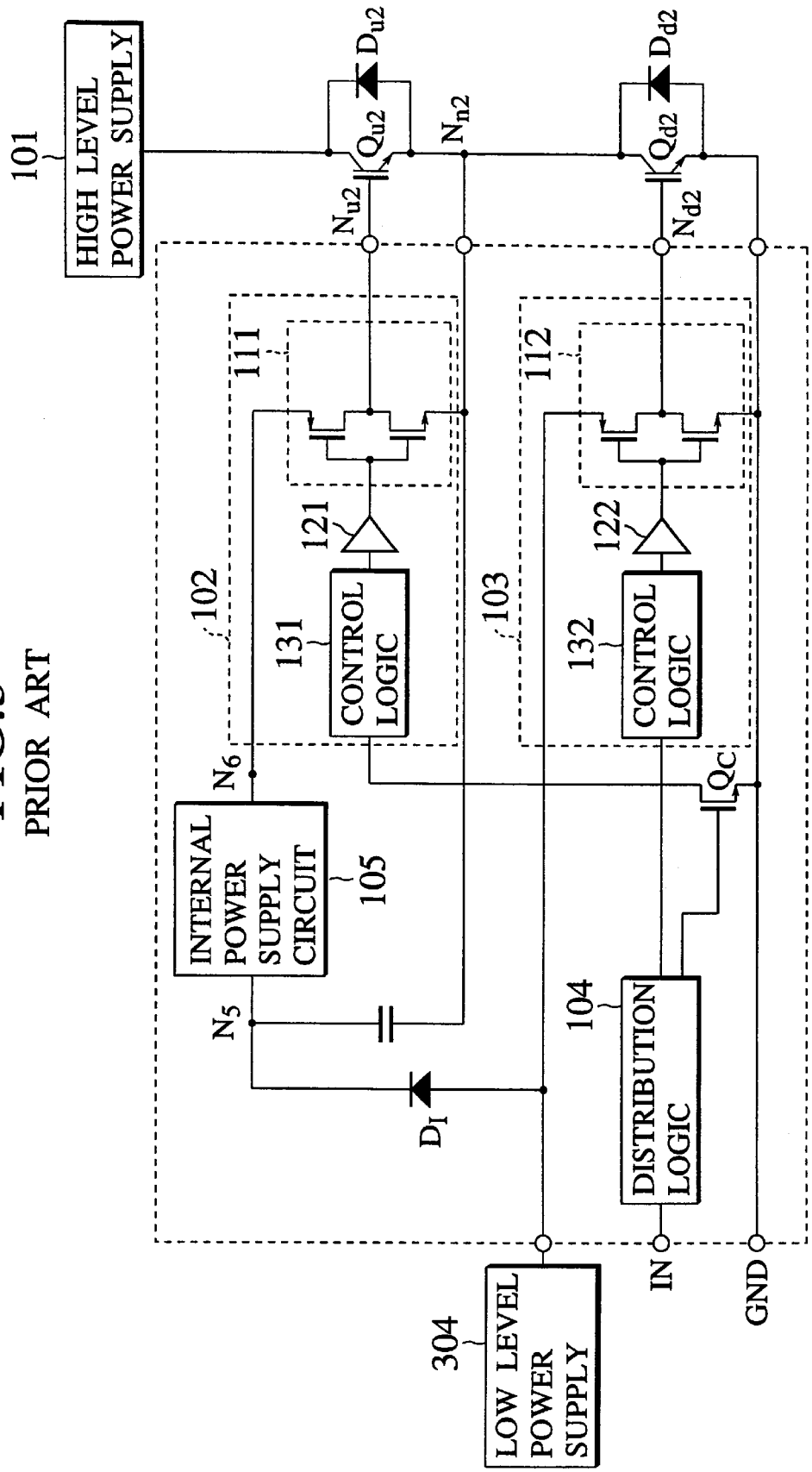
FIG. 3 is a circuit diagram of another output power unit and another conventional IC driver for driving the another output power unit.
Figure 4:
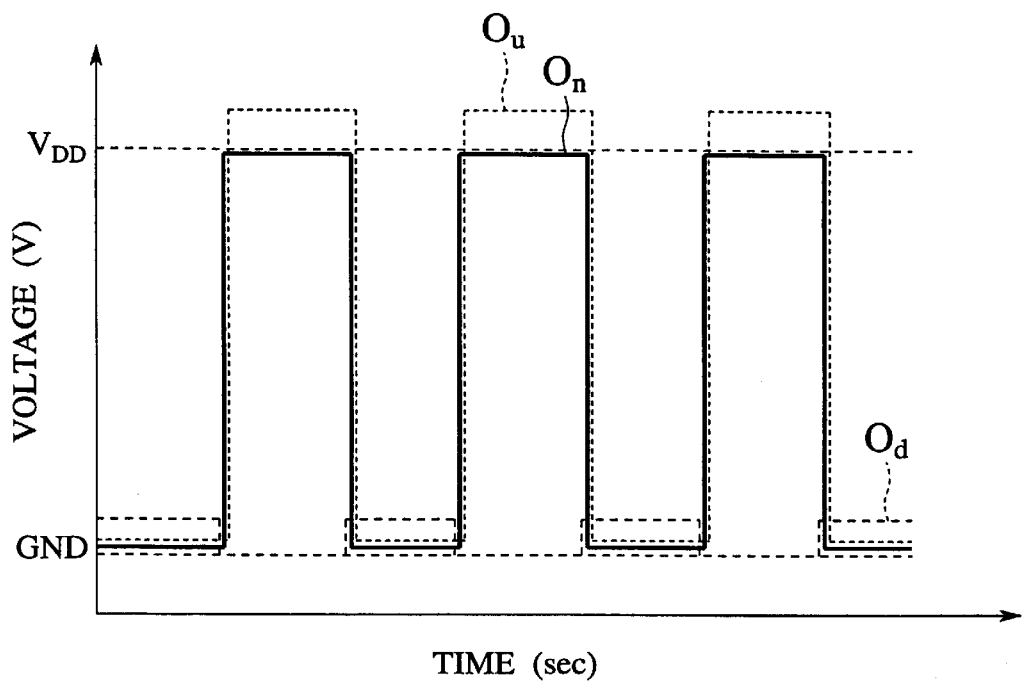
FIG. 4 shows the time variation of the upper-side output/ lower-side output/intermediate output of the IC driver illustrated in FIG. 2 and FIG. 3.
Figure 5A:
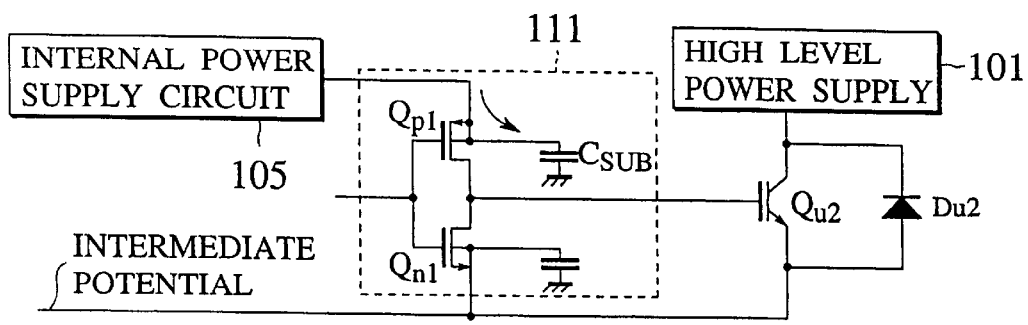
FIG. 5A is a circuit diagram showing the proximity of the output stage CMOS inverter of the conventional IC driver and FIG. 5B is a plan thereof.
Figure 5B:
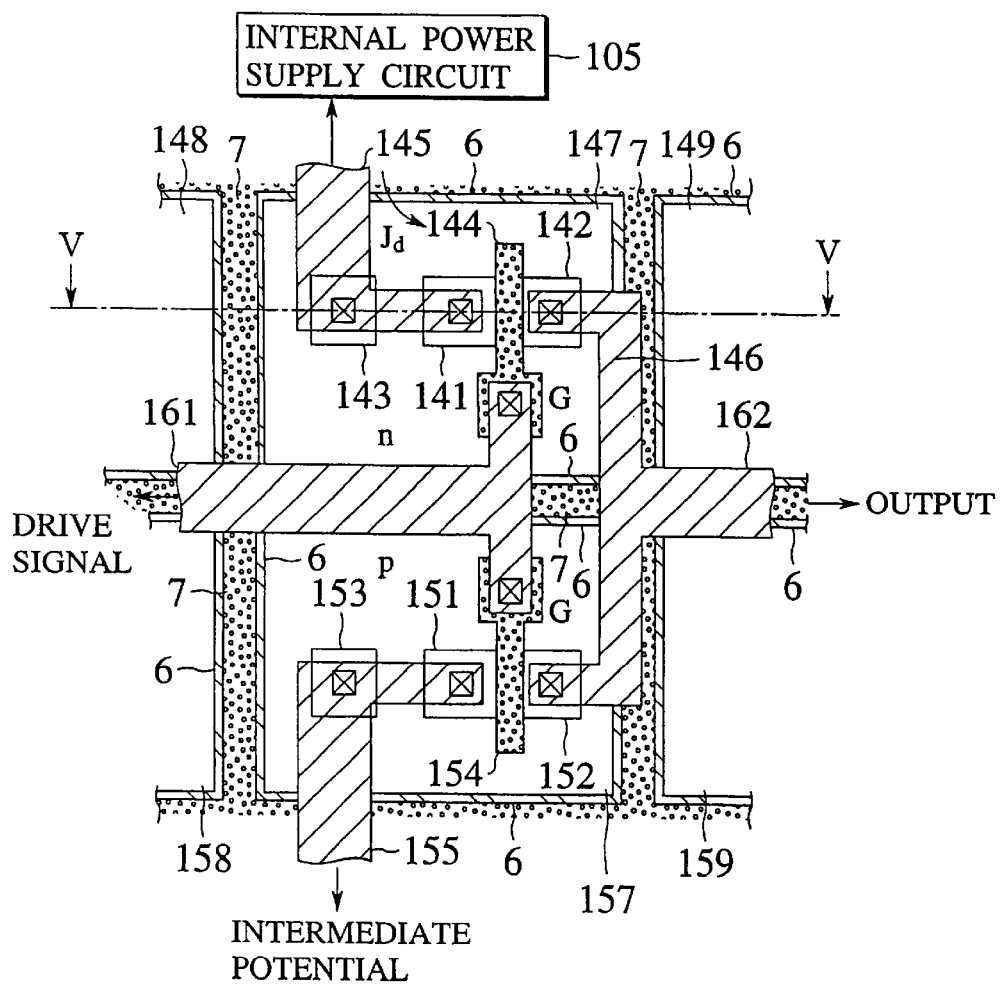
Figure 5C:
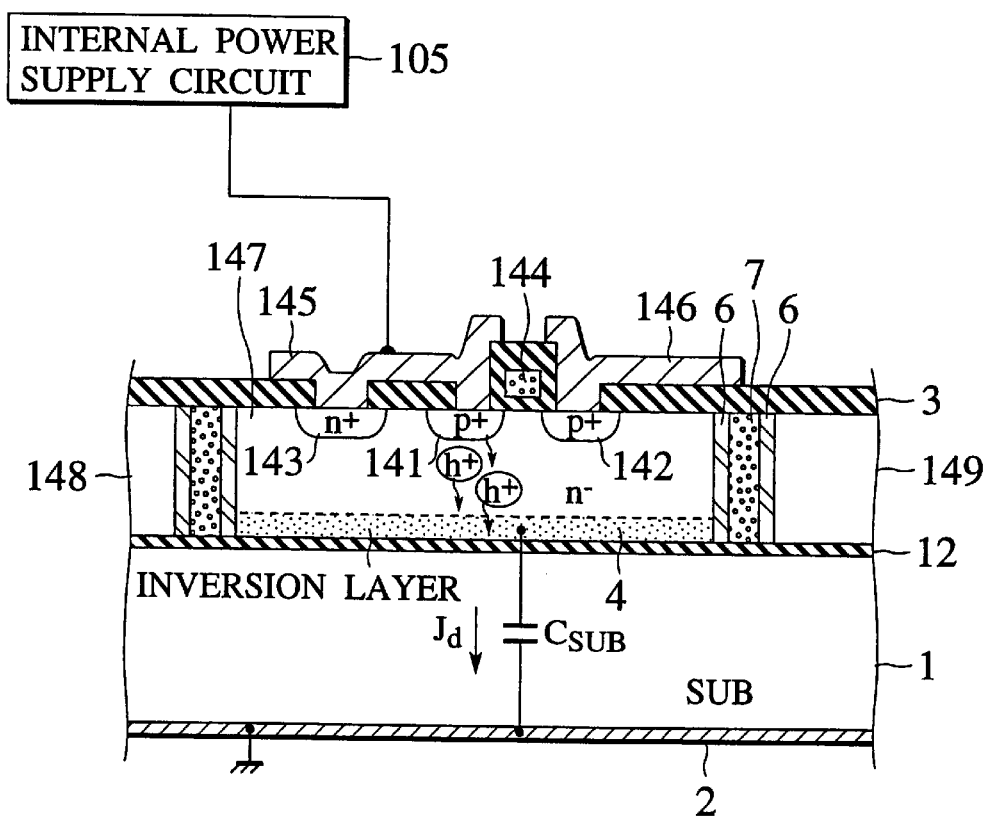
FIG. 5C is a cross-sectional view along V—V direction of FIG. 5B.
Figure 18A:
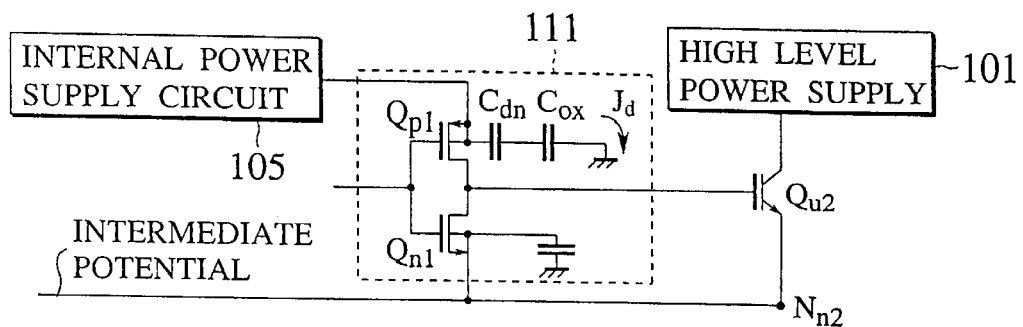
FIG. 18A is a reference diagram to compare with the IC driver according to a third embodiment of the present invention and is an equivalent circuit diagram showing the parasitic capacitance of the pMOS transistor $Q_{p1}$.
Figure 18B:
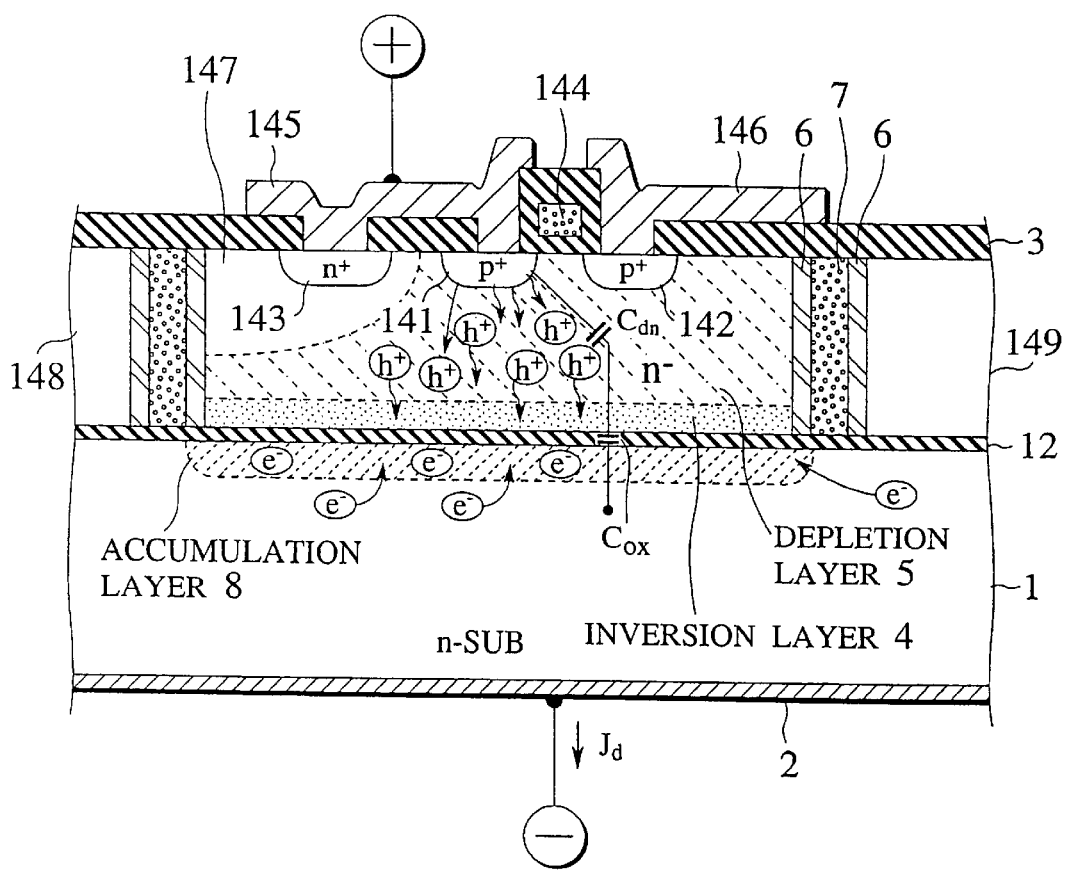
FIG. 18B illustrates particularly the pMOS transistor shown in FIG. 18A and is a schematic cross-sectional view illustrating the formation of an accumulation layer on the lower face of the SOI oxide film, by forming the pMOS transistor on the n type supporting substrate.

FIG. 18A is a equivalent circuit diagram to explain the drawback of the conventional IC driver comparing with the IC driver according to a third embodiment of the present invention. Namely, FIG. 18A illustrates a part of the upper-side driver 102 shown in FIG. 3, or the CMOS inverter 111 in the upper-side driver 102 and the parasitic condenser of this inverter 111. As shown in FIG. 18A, the CMOS inverter 111 is composed of pMOS transistor $Q_{p1}$ and the nMOS transistor $Q_{n1}$, and its output is input into the gate electrode of the IGBT serving as the upper-side output power device $Q_{u2}$. FIG. 18B illustrates schematically the cross-sectional view of the pMOS transistor $Q_{u1}$ in this CMOS inverter 111.

As shown in FIG. 18B, a floating state pMOS transistor $Q_{p1}$ is disposed in an semiconductor island (n− type semiconductor island) 147, whose bottom is separated by an SOI oxide film (buried insulation film) 12 disposed on the n type supporting substrate 1 and whose side is separated by the trench side wall insulation film (oxide film) 6 of the element isolation region. For this pMOS transistor $Q_{p1}$, n+ substrate contact region 143, p+ source region 141 and p+ drain region 142 are disposed in n− type semiconductor island 147, and positive potential is supplied to the n+ substrate contact region 143 and the p+ source region 141 through the metallic wiring from the internal power supply circuit 105. The potential of the back electrode 2 can be regarded as negative in respect of the positive potential supplied by the internal power supply circuit 105, because the back electrode 2 is usually set to the ground potential. In this biased state, an inversion layer 4 is formed at the bottom of and in the semiconductor island 147 just on the top of the SOI oxide film 12, while a depletion layer 5 is formed between the inversion layer 4 and the p+ source region 141. Electrons are accumulated at the top of and in the n type supporting substrate 1 just under the SOI oxide film 12 to form an accumulation layer 8. As the consequence, in the SOI structure shown in FIG. 18B, a parasitic condenser $C_{SUB}$, composed of a serial connection of a MOS-type condenser $C_{ox}$ having the SOI oxide film 12 as capacitor insulation film and a depletion layer capacitance $C_{dn}$ formed between the p+ source region 141 and the SOI oxide film 12, is formed. When such parasitic condenser $C_{SUB}$ having relatively large capacitance exists, as described above, if the voltage variation rate dV/dt at the intermediate potential increases, by accelerating the switching speed, up to more than several kV/μsec, the displacement current $J_d$ flowing in the parasitic condenser $C_{SUB}$ grows.

Figure 19A:
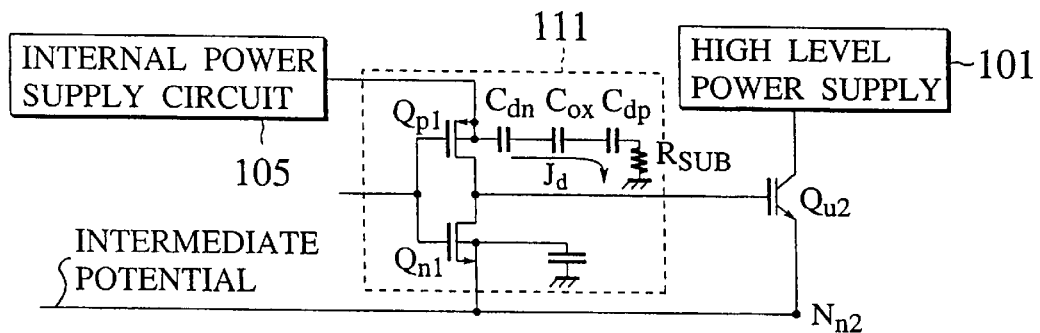
FIG. 19A is an equivalent circuit diagram showing the parasitic capacitance of the pMOS transistor $Q_{p1}$ of the IC driver according to the third embodiment of the present invention.
Figure 19B:
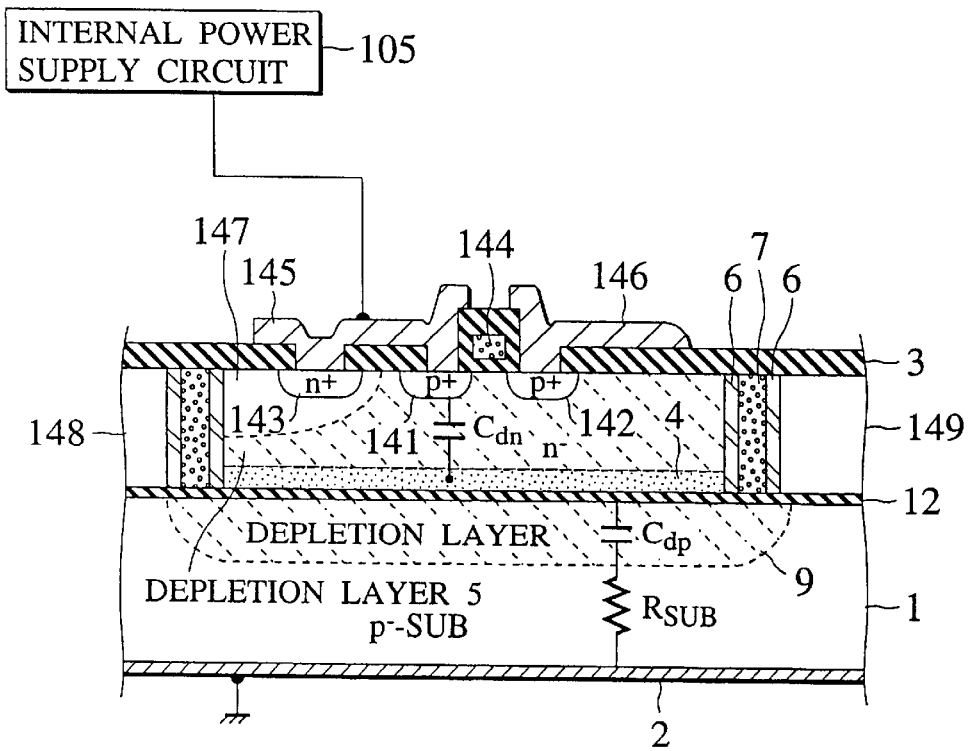
FIG. 19B illustrates particularly the pMOS transistor shown in FIG. 19A and is a schematic cross-sectional view illustrating the diffusion of a depletion layer across the p type supporting substrate, by forming the pMOS transistor on the n type supporting substrate.

FIG. 19A is a circuit diagram showing only the vicinity of the CMOS inverter composing the upper-side driver of the IC driver according to the third embodiment of the present invention. Similar to FIG. 18A, the CMOS inverter 111 is composed of pMOS transistor $Q_{p1}$ and the nMOS transistor $Q_{n1}$, and its output is input into the gate electrode of the IGBT serving as the upper-side output power device $Q_{u1}$. FIG. 19B illustrates schematically the cross-sectional view of the pMOS transistor $Q_{u2}$ in this CMOS inverter 111. However, different from FIG. 18A, a parasitic condenser $C_{SUB}$, composed of a serial connection of a depletion layer capacitance $C_{dn}$, a MOS-type condenser $C_{ox}$ and a depletion layer $C_{dp}$, is connected to the source of the pMOS transistor $Q_{p1}$.

FIG. 19B is a schematic cross-sectional view showing particularly the pMOS transistor $Q_{p1}$ for illustrating these depletion layer capacitance $C_{dn}$, MOS-type condenser $C_{ox}$ and depletion layer $C_{dp}$. As shown in FIG. 19B, the IC driver according to the third embodiment of the present invention is different from FIG. 18B in that it uses a p type supporting substrate. Other structures of this pMOS transistor $Q_{p1}$ are basically identical to FIG. 18B and the n+ substrate contact region 143 and the p+ source region 141 are supplied with positive potential. The potential of the back electrode 2 is negative in respect of the positive potential internal power supply circuit 105, because the back electrode 2 is usually set to the ground potential. In this biased state, an inversion layer 4 is formed on the top of the SOI oxide film 12, while a depletion layer 5 is formed between the inversion layer 4 and the p+ source region 141. However, as the p type supporting substrate 1 is used, different from 18B, at the top of and in the p type supporting substrate 1 just under the SOI oxide film 12 is formed a depletion layer 9. As the consequence, in the SOI structure shown in FIG. 19B, a parasitic condenser $C_{SUB}$, composed of a serial connection of a depletion layer capacitance $C_{dn}$ formed between the p+ source region 141, a MOS-type condenser $C_{ox}$ having the SOI oxide film 12 as capacitor insulation film and a depletion layer capacitance $C_{dp}$ formed under the SOI oxide film 12, is formed. Namely, when the n type supporting substrate is used, this parasitic capacitance $C_{SUBn}$ is expressed as follows:

$$1/C_{SUBn} = 1/C_{dn} + 1/C_{ox} \qquad (1)$$

On the other hand, when the p type supporting substrate is used, this parasitic capacitance $C_{SUBp}$ is expressed as follows:

$$1/C_{SUBp} = 1/C_{dn} + 1/C_{ox} + 1/C_{dp} \qquad (2)$$

The comparison between the expressions (1) and (2) indicates that $C_{SUBp}$ can be reduced substantially by forming a depletion layer at the top of and in the supporting substrate 1. Moreover, the reduction of $C_{SUBp}$ allows suppression of the output variation of the internal power supply circuit, because the displacement current $J_d$ flowing across the parasitic condenser $C_{SUBp}$ does not develop substantially, even if the intermediate potential output voltage variation rate dV/dt increases more than several kV/μsec.

Moreover, if the resistivity of the p type supporting substrate 1 increases by several dozens of Ω·cm to k Ω·cm, or further more, the equivalent resistance $R_{SUB}$ serially connected to $C_{SUBp}$ also increases, the displacement current $J_d$ can be reduced further. Further, by increasing the resistivity of the p type supporting substrate 1, the depletion layer width becomes larger in the p type supporting substrate 1. At a high resistivity of several kΩ·cm or more, if a predetermined high voltage is applied, substantially the whole p type supporting substrate 1 can be depleted. As the consequence, such large increase of depletion layer width reduces the $C_{SUBp}$ more remarkably.

Thus, in the IC driver according to the third embodiment of the present invention, as the displacement current $J_d$ flowing in the parasitic condenser $C_{SUBp}$ diminishes relatively according to the reduction of $C_{SUBp}$ value, the voltage drop of the internal power supply circuit due to the displacement current $J_d$, which was embarrassing conventionally, will hardly occur, even in a simple circuit configuration as shown in FIG. 8. In other words, it allows minimization of the internal power supply circuit, namely to minimize the chip size.

If the pMOS transistor shown in FIG. 19B is connected to specific circuitry other than the internal power supply circuit 105, the fluctuation of the circuit parameters relating to the specific circuitry subjected to the displacement current $J_d$ is suppressed or minimized, since the displacement current $J_d$ can be easily reduced by small $C_{SUBp}$ due to the formation of the depletion layer at the top of and in the supporting substrate 1. Then the circuit parameters of the specific circuitry become immune to the displacement current $J_d$, and stable and reliable operations are always implemented.

Moreover, such a simple circuit consumes less electric energy, permitting easily slashing the power dissipation of the driving circuit, and increasing the system power conversion efficiency. As the result, a high speed and a stable DI integrated circuit for driving output devices having a high breakdown voltage or high blocking voltage can be realized.

Figure 20:
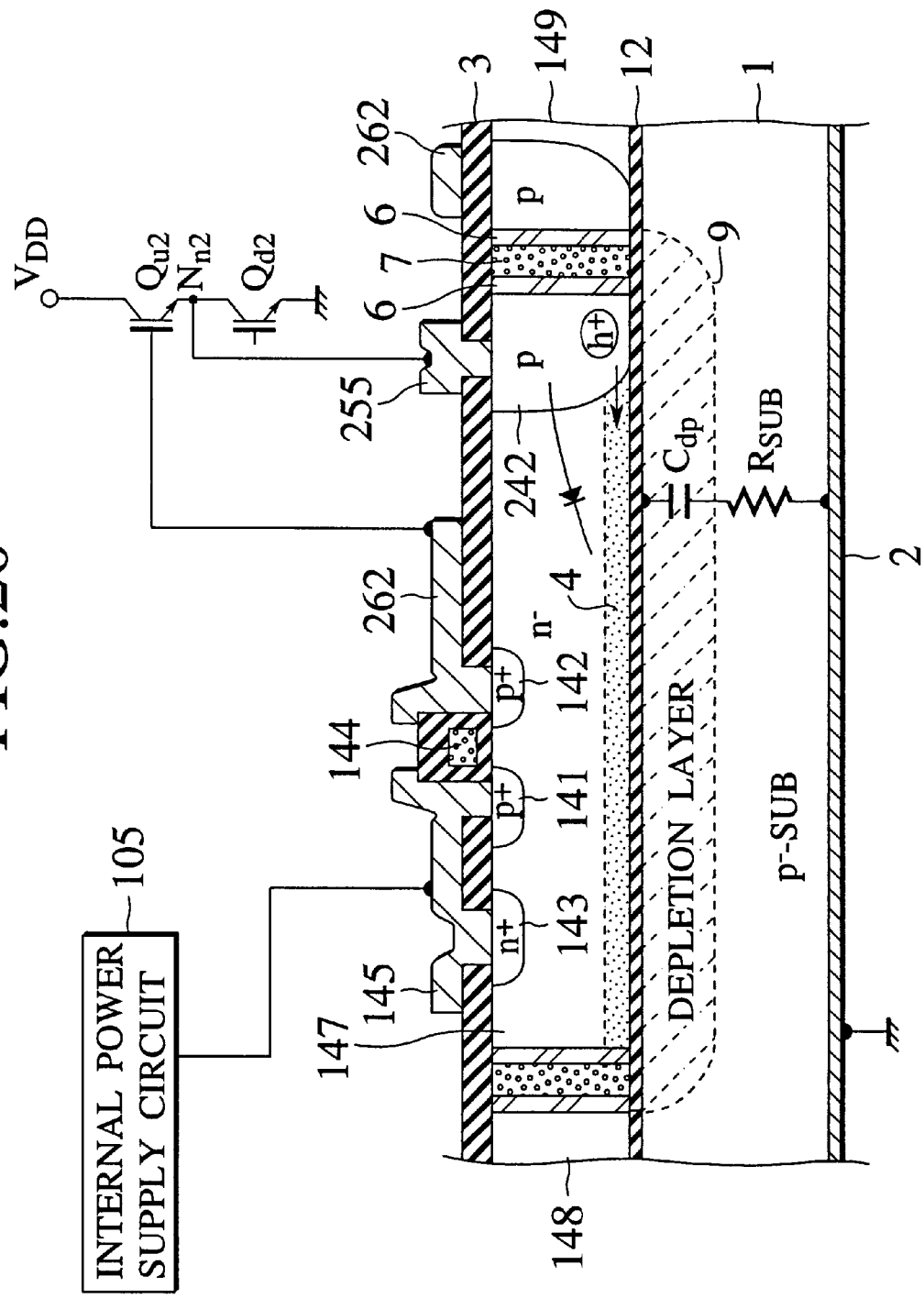
FIG. 20 is a partial schematic diagram of the IC driver according to a variant of the third embodiment of the present invention.

FIG. 20 is a partial schematic diagram of the IC driver according to a variant of the third embodiment of the present invention, and illustrates the cross-sectional view in which a depletion layer 9 is formed at the top of and in a p type supporting substrate 1 just under the SOI oxide film 12. Except for the p type supporting substrate 1, the variant of the third embodiment of the present invention shown in FIG. 20 is same as the IC driver according to the first embodiment of the present invention shown in FIG. 9B. As in FIG. 19B, a parasitic condenser $C_{SUB}$, composed of a serial connection of a depletion layer capacitance $C_{dn}$ formed between the $p^+$ source region 141, a MOS-type condenser $C_{ox}$ having the SOI oxide film 12 as capacitor insulation film and a depletion layer capacitance $C_{dp}$ formed at the top of and in a p type supporting substrate 1 just under the SOI oxide film 12, is formed, so the displacement current $J_d$ flowing in the parasitic condenser $C_{SUBp}$ does not increase so much, according to the reduction of $C_{SUBp}$ value. Moreover, as the displacement current $J_d$ is supplied with hole injection from the p injector region 242 connected to the intermediate potential $N_{n2}$, the voltage drop of the internal power supply circuit 105 can be suppressed.

Figure 21:
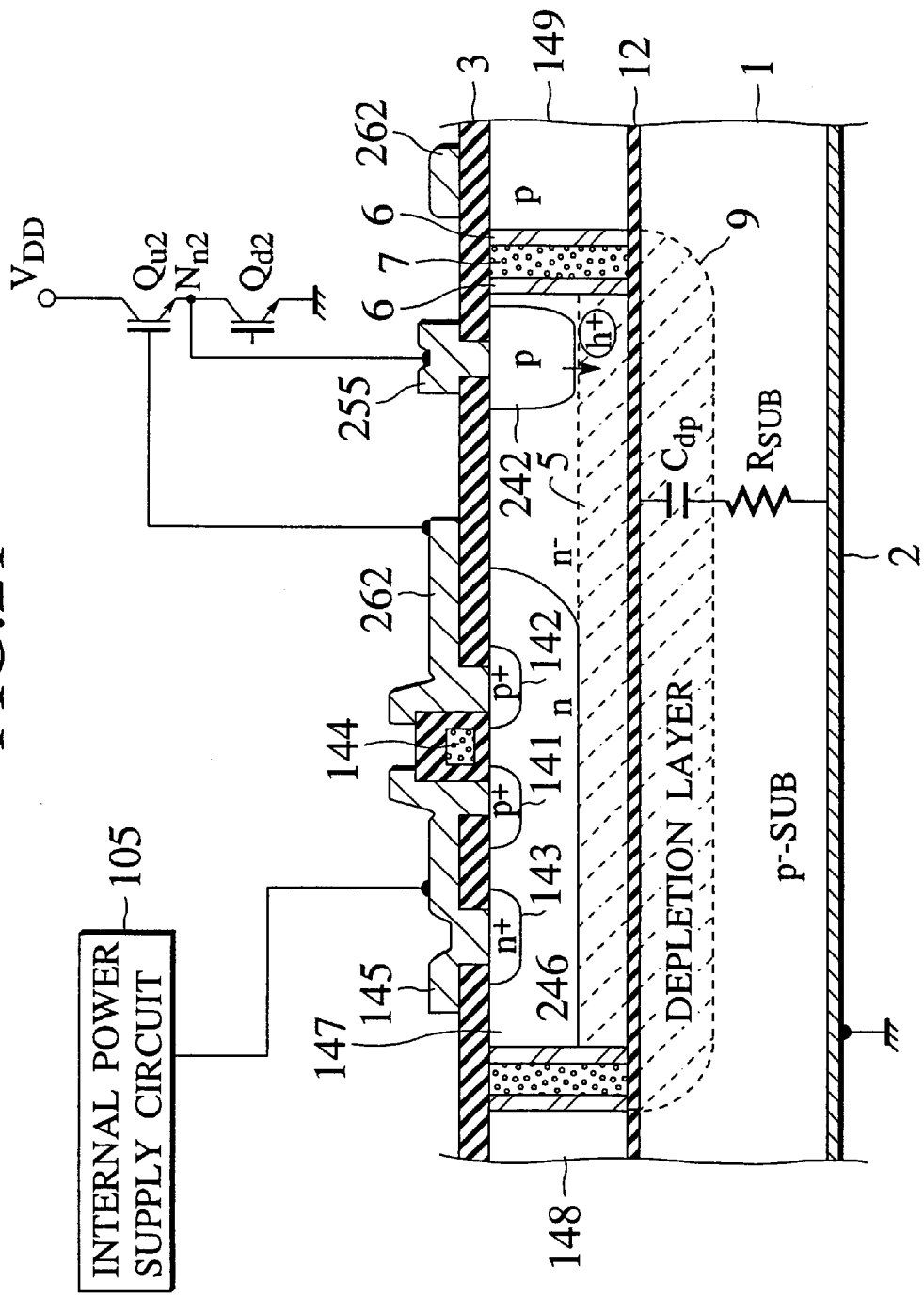
FIG. 21 is a partial schematic diagram of the IC driver according to another variant of the third embodiment of the present invention.

FIG. 21 is a partial cross-sectional view of the IC driver according to another variant of the third embodiment of the present invention, and illustrates the cross-sectional view in which a depletion layer 9 is formed at the top of and in a p type supporting substrate 1 just under the SOI oxide film 12. Except for the p type supporting substrate 1, the another variant of the third embodiment of the present invention shown in FIG. 21 is same as the IC driver according to the second embodiment of the present invention shown in FIGS. 17A to 17C. As shown in the cross-sectional view of FIG. 21, an n well 246 is disposed in the $n^−$ type semiconductor island 147, and a pMOS transistor is formed therein. In this structure, the depletion layer 5 extending from the SOI oxide film 12 is stopped at the position of the bottom of the n well 246 and does not reach to the $p^+$ source region 141. Similar to the IC driver shown in FIG. 19B, a parasitic condenser $C_{SUB}$, composed of a serial connection of a depletion layer capacitance $C_{dn}$ formed between the n well 246 and the SOI oxide film 12, a MOS-type condenser $C_{ox}$ having the SOI oxide film 12 as capacitor insulation film and a depletion layer capacitance $C_{dp}$ formed across the inferior face of the SOI oxide film 12, is formed, so the displacement current $J_d$ flowing in the parasitic condenser $C_{SUBp}$ does not increase so much, according to the reduction of $C_{SUBp}$ value. Moreover, as the displacement current $J_d$ is supplied with hole injection from the p injector region 242 connected to the intermediate potential $N_{n2}$, the voltage drop of the internal power supply circuit 105 can be suppressed.

Figure 22:
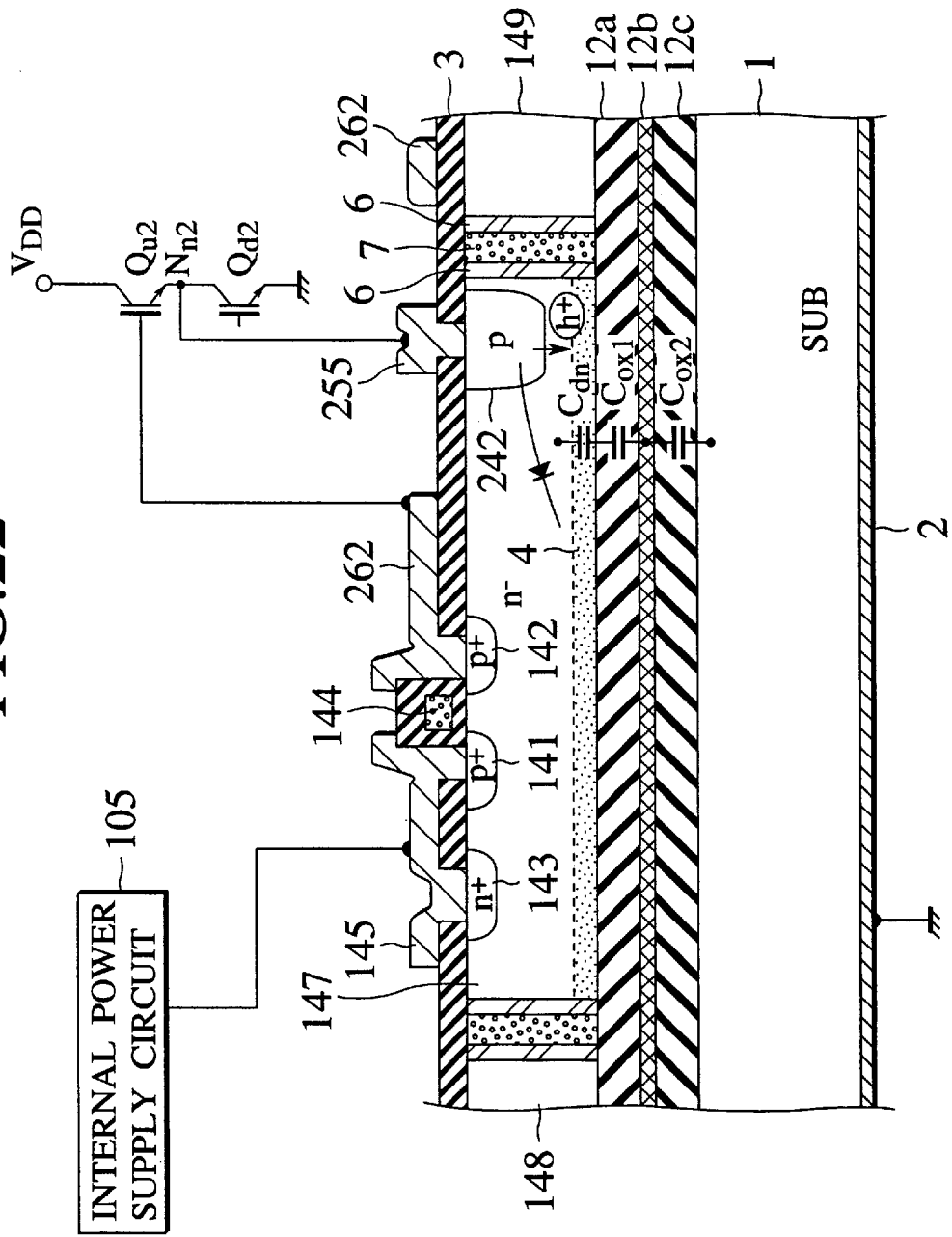
FIG. 22 is a partial schematic diagram of the IC driver according to still another variant of the third embodiment of the present invention.

Here, it will be also effective to reduce the capacitance of the MOS-type condenser $C_{ox}$ having an SOI oxide film as capacitor insulation film, to reduce the capacitance of the parasitic condenser $C_{SUB}$. FIG. 22 is a partial schematic diagram of the IC driver according to still another variant of the third embodiment of the present invention, and illustrates a structure where a first SOI oxide film 12a and a second SOI oxide film 12c are formed sandwiching a high conductive layer 12b. As the high conductive layer, doped polycrystalline silicon, W, Ti, Mo, or other refractory metals, their silicides ($WSi_2$, $TiSi_2$, $MoSi_2$) or the like, or polycides using these silicides may be adopted. As shown in FIG. 22, by forming two layers of SOI oxide films 12a and 12c, the capacitance $C_{ox}$ of these two layers of SOI oxide film 12a and 12c can be expressed as follows:

$$1/C_{ox}=1/C_{ox1}+1/C_{ox2} \qquad (3)$$

Here, $C_{ox1}$ is the capacitance of the MOS-type condenser having the SOI oxide film 12a as a capacitor insulation film, and $C_{ox2}$ is the capacitance of the MOS-type condenser having the SOI oxide film 12c as the capacitor insulation film. It shows that the formation of two layers of SOI oxide film 12a and 12c reduces the capacitance $C_{ox}$, reducing $C_{SUBp}$ remarkably. Therefore, as the displacement current $J_d$ flowing in the parasitic condenser $C_{SUBp}$ does not increase so much, the output variation of the internal power supply circuit can be suppressed. Furthermore, as the displacement current $J_d$ is supplied with hole injection from the p injector region 242 connected to the intermediate potential $N_{n2}$, the voltage drop of the internal power supply circuit 105 can be further suppressed to a negligible level.

(FOURTH EMBODIMENT)

In the IC driver according to the first to the third embodiments of the present invention, it has been described the circuit configuration wherein a set of external output power devices is driven, by the DI integrated circuit, or the IC driver comprising the control/drive circuit called half bridge driver. However, output power devices may also be monolithically integrated on a same semiconductor chip as the control/drive circuit to form so called "the power IC". The fourth embodiment of the present invention pertains to the power IC having the DI structure (referred as "the DI power IC" hereinafter).

Figure 23:
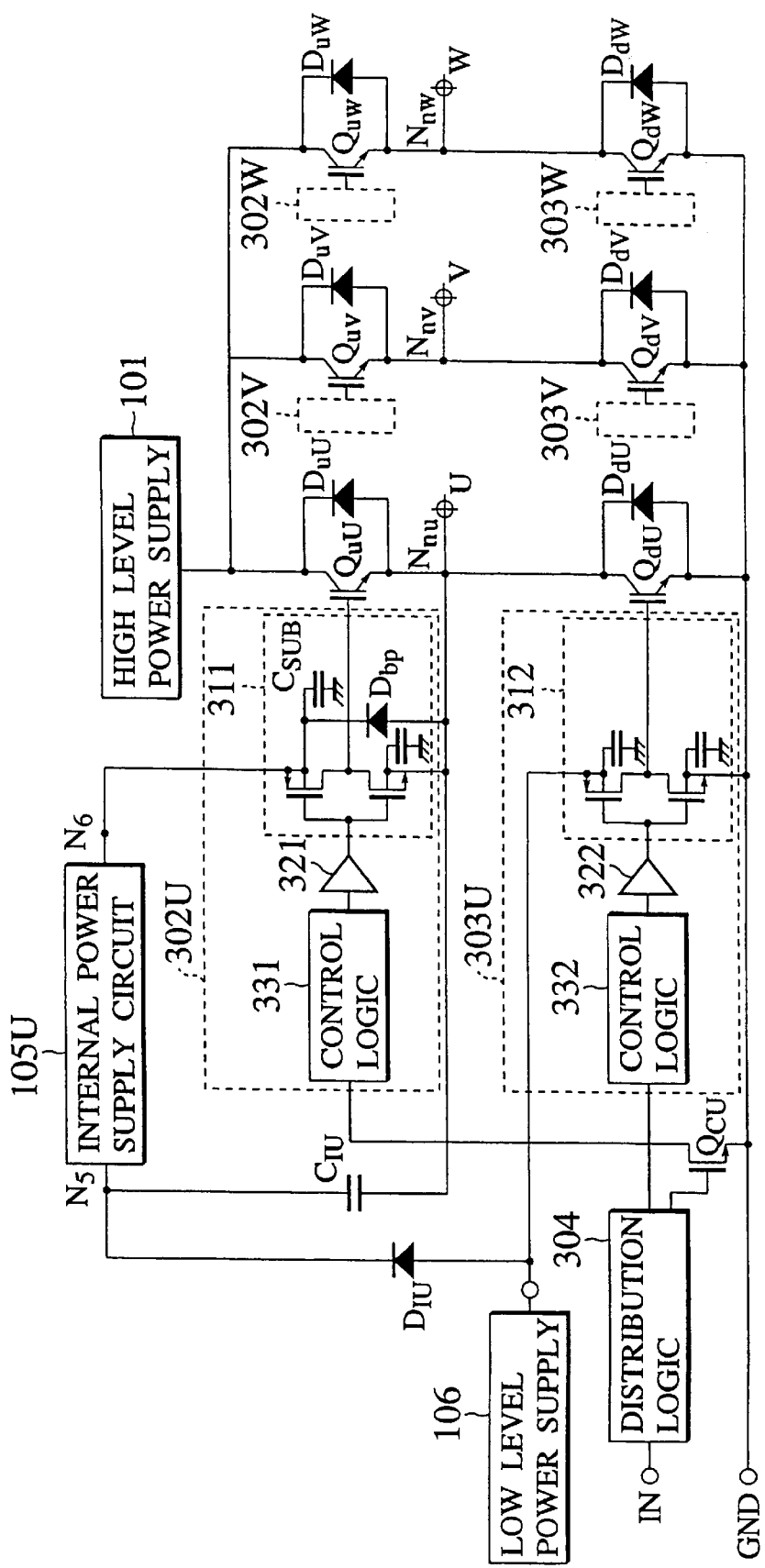
FIG. 23 is a circuit diagram of the power IC according to a fourth embodiment of the present invention.

In the DI power IC of the fourth embodiment of the present invention shown in FIG. 23, a set of output power devices and the control/drive circuit are integrated on a same semiconductor chip. The DI power IC shown in FIG. 23 is a circuit for driving the DC brush-less motor or the like, and comprises three-phased outputs of U/V/W. As shown in FIG. 23, three-phased output power devices comprises three sets of serial connection circuit of the upper-side and lower-side output power devices. That is, a first set comprises a serial connection circuit of the upper-side output power device $Q_{uU}$ and the lower-side output power device $Q_{dU}$ for the output U. A second set comprises a serial connection circuit of the upper-side output power device $Q_{uV}$ and the lower-side output power device $Q_{dV}$ for the output V. And a third set comprises a serial connection circuit of the upper-side output power device $Q_{uW}$ and the lower-side output power device $Q_{dW}$ for the output W. The three sets of serial connection circuit of the upper-side and lower-side output power devices are merged in a same semiconductor chip as the control circuit for driving them. Other output power devices than the IGBT shown in FIG. 23, such as MOSFET, GTO thyristor, SIT, SI thyristor, or the like may be used respectively as the upper-side output power devices $Q_{uU}$, $Q_{uV}$, $Q_{uW}$ and as the lower-side output power devices $Q_{dU}$, $Q_{dV}$, $Q_{dW}$. Respective first main electrodes of the upper-side output power devices $Q_{uU}$, $Q_{uV}$, $Q_{uW}$ are connected to the high-level power supply 101, while respective second main electrodes of the lower-side output power devices $Q_{dU}$, $Q_{dV}$, $Q_{dW2}$ are connected to the ground potential (GND). On the other hand, the second main electrode of the upper-side output power device $Q_{uU}$, and the first main electrode of the lower-side output power device $Q_{dU}$ are connected to the intermediate potential terminal $N_{nU}$, the second main electrode of the upper-side output power device $Q_{uV}$, and the first main electrode of the lower-side output power device $Q_{dV}$ are connected to the intermediate potential terminal $N_{nV}$, and the second main electrode of the upper-side output power device $Q_{uW}$, and the first main electrode of the lower-side output power device $Q_{dW}$ are connected to the intermediate potential terminal $N_{nW}$, and these respective intermediate potential terminals $N_{nU}$, $N_{nV}$ and $N_{nW}$ are connected to the three-phase load not illustrated.

As shown in FIG. 23, the upper-side output power device $Q_{uU}$ is driven by a floating state upper-side driver 302U, the upper-side output power device $Q_{uV}$ is driven by a floating state upper-side driver 302V, and the upper-side output power device $Q_{uW}$ is driven by a floating state upper-side driver 302W. In other words, the output terminals of the upper-side drivers 302U, 302V, 302W are connected to the respective control electrodes of the upper-side output power devices $Q_{uU}$, $Q_{uV}$, $Q_{uW}$. On the other hand, the output terminals of the lower-side drivers 303U, 303V, 303W are connected to the respective control electrodes of the lower-side output power devices $Q_{dU}$, $Q_{dV}$, $Q_{dW}$. The upper-side driver 302U is connected between the internal power supply circuit 105U and the intermediate potential terminal $N_{nU}$, the upper-side driver 302V is connected between another internal power supply circuit independent from the internal power supply circuit 105U and the intermediate potential terminal $N_{nV}$, the upper-side driver 302W is connected between still another internal power supply circuit independent from the internal power supply circuit 105U and the intermediate potential terminal $N_{nW}$, and they are respectively supplied with a predetermined power supply voltage. The internal power supply circuit 105U is the simple circuit of the aforementioned bootstrap design, for example. The internal power supply circuit 105U is connected to the low-level power supply electrode 106 via a diode $D_{IU}$ and a condenser $C_{IU}$ is disposed at the connection with the diode $D_{IU}$. Other diodes different from the diode $D_{IU}$ and other condensers different from the condenser $C_{IU}$ are connected, respectively to the other independent internal power supply circuits for V phase and W phase.

On the other hand, the lower-side drivers 303U, 303V and 303W are connected, respectively, to the low-level power supply electrode 106 and the ground potential (GND), and supplied with a predetermined voltage. An upper-side control signal from a distribution logic 304 is supplied to the upper-side driver 302U via a transistor $Q_{CU}$, while a lower-side control signal from the distribution logic 304 is supplied directly to the lower-side driver 303U. Similarly, an upper-side control signal from the distribution logic 304 is supplied to the upper-side driver 302V, 302W via a transistor, while a lower-side control signal from the distribution logic 304 is supplied directly to the lower-side driver 303V, 303W.

As shown in FIG. 23, the upper-side driver 302U is composed of an upper-side CMOS inverter 311, an upper-side buffer amp 321 and an upper-side control logic 331. On the other hand, the lower-side driver 303U is composed of a lower-side CMOS inverter 312, a lower-side buffer amp 322 and a lower-side control logic 332. Though not illustrated, it is evident that the upper-side drivers 302V, 302W and the lower-drivers 303V, 303W have similar circuit configurations.

In the circuit configuration shown in FIG. 23, the upper-side output power devices $Q_{uU}$, $Q_{uV}$, $Q_{uW}$ and the lower-side output power devices $Q_{dU}$, $Q_{dV}$, $Q_{dW}$ are driven respectively by the upper-side drivers 302U, 302V, 302W and the lower-side drivers 303U, 303V, 303W and switched on and off alternatively. As the result, the potentials of the intermediate potential terminals $N_{nU}$, $N_{nV}$, $N_{nW}$ swing between potential levels of the ground potential (GND) and the high level power supply 101 in accordance with the alternative on and off of the upper-side output power devices $Q_{uU}$, $Q_{uV}$, $Q_{uW}$ and the lower-side output power devices $Q_{dU}$, $Q_{dV}$, $Q_{dW}$.

Therefore, as for the conventional circuits 302U, 303V, 303W in the upper arms of the respective systems, the internal power supply voltage may subject to drop significantly, as the displacement currents $J_d$ flow in the respective parasitic condensers $C_{SUBp}$, similarly as the case of the half bridge driver described for the first embodiment. However, in the power IC according to the forth embodiment of the present invention, respective bypass diodes $D_{bp}$ are connected to the CMOS inverters composing the circuit 302U, 303V, 303W in the upper arms, and connected to the intermediate potential terminals $N_{nU}$, $N_{nV}$, $N_{nW}$ via these bypass diodes $D_{bp}$. Since only the upper-side driver 302U is shown in FIG. 23 for convenience' sake, the description in the following will refer to this upper-side driver 302U, however the same is valid for other upper-side drivers 302V, 302W.

Namely, as shown in FIG. 23, the CMOS inverter 311 constituting the upper-side driver 302U is composed of a pMOS transistor and nMOS transistor. A source electrode (first main electrode) of the pMOS transistor is connected to the internal power supply circuit 105U and a drain electrode (second main electrode) to the drain electrode of the nMOS transistor. And a substrate electrode of the pMOS transistor is connected simultaneously to the source electrode of the pMOS transistor, and to the intermediate potential terminal $N_{nU}$ through the bypass diode $D_{bp}$.

This bypass diode $D_{bp}$ may be realized by providing an anode region with the p injector region and a cathode region with the n-type semiconductor island (first semiconductor island )147 as shown in FIG. 7C, FIG. 9A or FIGS. 17A to C, and connecting this p injector region to the intermediate potential terminal $N_{nU}$. To be more specific, a pMOS transistor as the switching device is disposed in the semiconductor island (first semiconductor island)147 separated from the adjacent semiconductor islands by the bottom and the side dielectric films, and supplied with current component for compensating the displacement current flowing in a parasitic condenser caused by a bottom dielectric film such as buried insulation film or the like. Meanwhile, the lower-side driver 303U having the CMOS inverter 312 may be disposed in another semiconductor island (second semiconductor island). The bottom dielectric film disposed under the first and second semiconductor islands may be the buried insulation film, or the like. By connecting the p injector region to the intermediate potential, the voltage drop of the internal power supply circuit 105U disposed in another semiconductor island (third semiconductor island) due to the large displacement current $J_d$ can be prevented or suppressed.

Thus, in the power IC according to a fourth embodiment of the present invention, the displacement current $J_d$ flowing through the parasitic condenser $C_{SUB}$ is mainly supplied by hole injection from the bypass diode $D_{bp}$. As the consequence, the voltage drop of the internal power supply circuit due to the displacement current $J_d$, which was bothersome conventionally, will hardly occur, even in a simple circuit configuration as shown in FIG. 8. It is also valid for the circuits for V and W phases not illustrated in FIG. 23 for convenience' sake. Consequently, it allows minimization of the respective internal power supply circuits for U, V and W phases, and as the result the total chip size can be scaled down. Moreover, such a simple circuit requires less electric energy, it is easy to diminish the power dissipation of the driving circuit of the power IC, and improving the system power conversion efficiency. As the result, a high breakdown voltage (or high blocking voltage power) IC capable of stable and high speed operations can be realized.

(OTHER EMBODIMENTS)

Various modifications will become possible for those skilled in the art after receiving the teaching of the present disclosure without departing from the scope thereof In the description of the first to the fourth embodiments mentioned above, the case where pMOS transistor is floating is explained; however, the technical feature of the present invention in not limited to the pMOS transistor described for these embodiments. It may well be applied to other semiconductor devices such as nMOS transistor, npn bipolar transistor, pnp bipolar transistor, n channel SIT, p channel SIT or diode. For example, it is the case where a p well exists in the n type semiconductor and an nMOS transistor is formed therein. In many cases, the p well in the n type semiconductor island is connected to the low potential side, or the reference potential, namely the intermediate potential. As the floating state will not occur in this case, it is unnecessary to apply the present invention. However, for the nMOS transistor where the p well is used in the floating state, floating from the reference potential, a p injector region may well be provided and this p injector region will be fixed to the intermediate potential, similarly to the first to fourth embodiment. In this case, the p injector region may be formed keeping a certain distance from the p well forming the device (nMOS transistor). It is evident that this "certain distance" between diffusion layers is designed to have such reverse breakdown voltage to supporting the internal power supply voltage.

In other words, the present invention can be applied to the DI integrated circuit where a semiconductor island subjecting to the floating state has a p diffusion, which is connected to the internal power supply circuit, and this application will assure its effective function. In these various semiconductor devices also, a p injector region for supply displacement current component may be provided and this p injector region may be fixed to the intermediate potential, similarly to the first to fourth embodiments. In many cases, as this p injector region is reverse biased in respect of the semiconductor island of the object semiconductor device, it will not affect their operation. Or, as in the case of nMOS transistor mentioned above, the p well and the p injector region of the present invention are arranged at a distance to maintain a reverse breakdown voltage corresponding to the internal power supply voltage, in order not to affect the operation of these semiconductor devices.

Although the description of the first to the fourth embodiments referred to the cases in which the upper-side output power device are connected to the positive high level power supplies, and the upper-side drivers connected to the control electrodes of the upper-side output power devices, which are in the floating states, the present invention is not limited to these cases. As similar technical feature may well also be applied to any IC drivers and any power ICs having the DI structures, in which the disadvantageous displacement currents due to the potential variations of the supporting substrates composing the SOI structures. Namely, it is evident that it may well be applied to any IC driver and any power IC having other potential relations and bias conditions in them. In other words, it may well be applied to the reversed potential relation, such as the power IC in which a lower-side output power device is connected to the negative high level power supply, and the lower-side driver is connected to the control electrode of the lower-side output power device. In this reversed potential relation, the lower-side output power device and the lower-side driver are in a floating state. It can be understood that, in such a reversed potential relation, it can be applied by inverting the polarity and the conductivity type in the description of the first to the fourth embodiments mentioned above. Further, in such a reversed potential relation, it is obvious that an n type supporting substrate should be used in place of the p type supporting substrate, in order to extend the depletion layer at the top of and in the n type supporting substrate just under the SOI insulating film, modifying the description in the third embodiment.

Thus, it should be understood that the present invention comprises various embodiments not described herein. Therefore, the present invention shall be limited only by the appended claims.

What is claimed is:

1. An IC driver for driving a series circuit of an upper-side and a lower-side output power devices, the upper-side output power device having a first main electrode to be supplied with a first level power supply, a control electrode and a second main electrode, the lower-side output power device having a first main electrode connected to the second main electrode of the upper-side output power device via an intermediate potential terminal, a control electrode and a second main electrode to be supplied with a second level potential lower than the first level potential, one of the first and second level potentials is ground potential, the IC driver comprising:

an internal power supply circuit electrically isolated from the ground potential;

a semiconductor island of a first conductivity type;

a dielectric film contacted with the semiconductor island at its bottom and side thereof;

a switching device having a first main electrode region of a second conductivity type opposite to the first conductivity type, being supplied with an operating current from the internal power supply circuit, and a second main electrode region of the second conductivity type being electrically isolated from the ground potential, both disposed in the semiconductor island, the second main electrode region of the switching device supplies a control signal to the control electrode of one of the upper-side and lower-side output power devices which is electrically isolated from the ground potential so as to operate in a floating state; and an injector region of the second conductivity type for injecting a carrier so as to supply a displacement current flowing through a parasitic condenser associated with the dielectric film disposed at the bottom of the semiconductor island, disposed in said semiconductor island, at a position separated from said first and second main electrode regions of the switching device.

2. The IC driver of claim 1, wherein said injector region is connected to a predetermined reference potential electrically isolated from the first and second level potential.

3. The IC driver of claim 2, wherein said reference potential is an intermediate potential supplied from the intermediate potential terminal.

4. The IC driver of claim 1, wherein bottom of said injector region is formed deeper than said first and second main electrode regions.

5. The IC driver of claim 1, wherein bottom of said injector region reaches to said dielectric film at the bottom.

6. An IC driver for driving a series circuit of an upper-side and a lower-side output power devices, the upper-side output power device having a first main electrode to be supplied with a first level power supply, a control electrode and a second main electrode, the lower-side output power device having a first main electrode connected to the second main electrode of the upper-side output power device via an intermediate potential terminal, a control electrode and a second main electrode to be supplied with a second level potential lower than the first level potential, one of the first and the second level potential is ground potential, the IC driver comprising:

a supporting substrate;

a buried insulation film disposed on the supporting substrate;

a first semiconductor island of a first conductivity type and other semiconductor islands adjacent to the first semiconductor island disposed on the buried insulation film;

a dielectric isolation region for separating from each other the first semiconductor island from said other semiconductor islands adjacent to the first semiconductor island;

an internal power supply circuit disposed in one of said other semiconductor islands, electrically isolated from the ground potential;

a switching device having a first main electrode region of a second conductivity type opposite to the first conductivity type, being supplied with an operating current from the internal power supply circuit, and a second main electrode region of the second conductivity type being electrically isolated from the ground potential, both disposed in the first semiconductor island, the second main electrode region of the switching device supplies a control signal to the control electrode of one of the upper-side and lower-side output power devices which is electrically isolated from the ground potential so as to operate in a floating state; and an injector region of the second conductivity type for injecting a carrier so as to supply a displacement current flowing through a parasitic condenser constructed by the first semiconductor island, the buried insulation film and the supporting substrate, the injector region being disposed in the first semiconductor island, separately from said first and second main electrode regions of the switching device.

7. The IC driver of claim 6, wherein said injector region is connected to a predetermined reference potential electrically isolated from the first and second level potentials.

8. The IC driver of claim 7, wherein said reference potential is an intermediate potential supplied from the intermediate potential terminal.

9. The IC driver of claim 6, wherein bottom of said injector region is formed deeper than the first and second main electrode regions.

10. The IC driver of claim 6, wherein bottom of said injector region reaches to said buried insulation film.

11. The IC driver of claim 6, wherein said supporting substrate is said second conductivity type.

12. The IC driver of claim 6, further comprising:

a well of said first conductivity type disposed in said first semiconductor island so as to form said first and second main electrode regions in the well.

13. An IC driver for driving a set of an upper-side and a lower-side output power devices, the upper-side output power device having a first main electrode connected to a high level power supply, a control electrode and a second main electrode the lower-side output power device having a first main electrode connected to the second main electrode of the upper-side output power device via an intermediate potential terminal, a control electrode and a second main electrode connected to ground potential (GND), the IC driver comprising:

first to third semiconductor islands electrically isolated from the adjacent semiconductor islands by a bottom dielectric film and a side dielectric film;

an upper-side driver electrically isolated from the ground potential, comprising at least a switching device disposed in said first semiconductor island, an output of the upper-side driver is supplied to the control electrode of said upper-side output power device;

an injector region disposed in said first semiconductor island, for injecting a carrier so as to supply a displacement current flowing in a parasitic condenser having said bottom dielectric film, disposed at a bottom of said first semiconductor island, as a capacitor insulating film;

a lower-side driver, comprising another switching device disposed in said second semiconductor island, an output of the lower-side driver is supplied to the control electrode of said lower-side output power device; and an internal power supply circuit electrically isolated from the ground potential, disposed in said third semiconductor island for supplying said upper-side driver with a predetermined voltage.

14. The IC driver of claim 13, wherein said injector region is connected to a predetermined reference potential electrically isolated from the high level power supply and the ground potential.

15. The IC driver of claim 14, wherein said reference potential is an intermediate potential supplied from the intermediate potential terminal.

16. The IC driver of claim 13, wherein bottom of said injector region is formed deeper than a first and second main electrode regions of said switching device in said first semiconductor island.

17. The IC driver of claim 13, wherein bottom of said injector region reaches to said dielectric film at the bottom.

18. A power IC comprising:

a semiconductor chip;

an upper-side output power device merged in said semiconductor chip, having a first main electrode of the upper-side output power device connected to a high level power supply, a control electrode and a second main electrode;

a lower-side output power device merged in said semiconductor chip, having a first main electrode connected to the second main electrode of the upper-side output power device via an intermediate potential terminal, a control electrode and a second main electrode connected to ground potential (GND);

first to third semiconductor islands electrically isolated from the adjacent semiconductor islands by a bottom dielectric film and a side dielectric film;

an upper-side driver electrically isolated from the ground potential, comprising at least a switching device disposed in said first semiconductor island, an output of the upper-side driver is connected to the control electrode of said upper-side output power device;

an injector region disposing said first semiconductor island, for injecting carrier so as to supply a displacement current flowing in a parasitic condenser having said bottom dielectric film, disposed at a bottom of said first semiconductor island, as a capacitor insulating film;

a lower-side driver, comprising another switching device disposed in said second semiconductor island, an output of the lower-side driver is connected to the control electrode of said lower-side output power device; and an internal power supply circuit electrically isolated from the ground potential disposed in said third semiconductor island for supplying said upper-side driver with a predetermined voltage.

19. The power IC of claim 18, wherein said injector region is connected to a predetermined reference potential electrically isolated from the high level power supply and the ground potential.

20. The power IC of claim 19, wherein said reference potential is an intermediate potential supplied from the intermediate potential terminal.

21. The power IC of claim 18, wherein bottom of said injector region is formed deeper than a first and second main electrode regions of said switching device in said first semiconductor island.

22. The power IC of claim 18, wherein bottom of said injector region reaches to said dielectric film at the bottom.

23. The power IC of claim 18, wherein said bottom dielectric film is disposed on the supporting substrate having a conductivity type identical to that of said injector region.

24. An IC driver for driving a set of an upper-side and a lower-side output power devices, the upper-side output power device having a first main electrode to be supplied with a high level power supply, a control electrode and a second main electrode, the lower-side output power device having a first main electrode connected to the second main electrode of the upper-side output power device via an intermediate potential terminal, a control electrode and a second main electrode to be supplied with ground potential, the IC driver comprising:

first to third semiconductor islands of the first conductivity type electrically isolated from the adjacent semiconductor islands by a bottom dielectric film and a side dielectric film;

an upper-side driver electrically isolated from the ground potential, comprising at least a switching device disposed in said first semiconductor island, an output of the upper-side driver is supplied to the control electrode of said upper-side output power device;

an injector region of the second conductivity type opposite to the first conductivity type, disposed in said first semiconductor island, for injecting a carrier so as to supply a displacement current flowing in a parasitic condenser having said bottom dielectric film, disposed at a bottom of said first semiconductor island, as a capacitor insulating film;

a lower-side driver, comprising another switching device disposed in said second semiconductor island, an output of the lower-side driver is supplied to the control electrode of said lower-side output power device; and an internal power supply circuit electrically isolated from the ground potential, disposed in said third semiconductor island for supplying said upper-side driver with a predetermined voltage.

25. A power IC comprising:

a semiconductor chip;

an upper-side output power device merged in said semiconductor chip, having a first main electrode of the upper-side output power device connected to a high level power supply, a control electrode and a second main electrode;

a lower-side output power device merged in said semiconductor chip, having a first main electrode to be supplied with the second main electrode of the upper-side output power device via an intermediate potential terminal, a control electrode and a second main electrode to be supplied with ground potential;

first to third semiconductor islands of a first conductivity type, electrically isolated from the adjacent semiconductor islands by a bottom dielectric film and a side dielectric film;

an upper-side driver electrically isolated from the ground potential, comprising at least a switching device disposed in said first semiconductor island, an output of the upper-side driver is connected to the control electrode of said upper-side output power device;

an injector region of the second conductivity type disposed in said first semiconductor island, for injecting a carrier so as to supply a displacement current flowing in a parasitic condenser having said bottom dielectric film, disposed at a bottom of said first semiconductor island, as a capacitor insulating film;

a lower-side driver, comprising another switching device disposed in said second semiconductor island, an output of the lower-side driver is connected to the control electrode of said lower-side output power device; and an internal power supply circuit electrically isolated from the ground potential, disposed in said third semiconductor island for supplying said upper-side driver with a predetermined voltage.

* * * * *